(12) United States Patent
Yamaguchi et al.

(10) Patent No.: US 10,690,968 B2
(45) Date of Patent: Jun. 23, 2020

(54) DISPLAY DEVICE AND ELECTRONIC APPARATUS

(71) Applicant: Japan Display Inc., Tokyo (JP)

(72) Inventors: Jun Yamaguchi, Aichi (JP); Morikazu Nomura, Aichi (JP); Takashi Fujimura, Kanagawa (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 16/221,022

(22) Filed: Dec. 14, 2018

(65) Prior Publication Data

US 2019/0129212 A1 May 2, 2019

Related U.S. Application Data

(63) Continuation of application No. 15/799,074, filed on Oct. 31, 2017, now Pat. No. 10,191,333, which is a (Continued)

(30) Foreign Application Priority Data

Jun. 7, 2011 (JP) .................................. 2011-127599

(51) Int. Cl.
*G02F 1/1339* (2006.01)
*G09G 3/36* (2006.01)
(Continued)

(52) U.S. Cl.
CPC .......... *G02F 1/1339* (2013.01); *G02F 1/1368* (2013.01); *G02F 1/133345* (2013.01);
(Continued)

(58) Field of Classification Search
CPC ............. G02F 1/1339; G02F 1/133345; G02F 1/1368; G02F 2001/133311;
(Continued)

(56) References Cited

U.S. PATENT DOCUMENTS 10,191,333 B2 * 1/2019 Yamaguchi ......... H01L 51/5246
2006/0215102 A1 9/2006 Otose et al.
(Continued)

FOREIGN PATENT DOCUMENTS

CN 10-2033376 4/2011
JP 01-239528 9/1989
(Continued)

OTHER PUBLICATIONS

Japanese Office Examination report issued in connection with related Japanese Patent Application No. 2011-127599 dated Jun. 17, 2014.
Chinese Office Examination report issued in corresponding Chinese Patent Application No. CN 201210171627.4 dated Sep. 2, 2015 with English translation.
(Continued)

*Primary Examiner* — Nathanael R Briggs
(74) *Attorney, Agent, or Firm* — Dentons US LLP

(57) ABSTRACT

A display device including a pixel section provided between a pair of substrates and including plural pixels; one or plural active components disposed in a frame region around the pixel section on one substrate of the pair of substrates; an insulating film provided in the frame region on the one substrate to cover the one or plural active components; and a sealing layer provided to seal the pixel section and cover an end edge portion of the insulating film in the frame region.

17 Claims, 19 Drawing Sheets

Related U.S. Application Data continuation of application No. 15/075,302, filed on Mar. 21, 2016, now Pat. No. 9,835,905, which is a continuation of application No. 14/566,169, filed on Dec. 10, 2014, now Pat. No. 9,323,109, which is a continuation of application No. 13/485,618, filed on May 31, 2012, now Pat. No. 8,982,306.

(51) Int. Cl.

| | | |
|---|---|---|
| *H01L 27/12* | (2006.01) | |
| *H01L 27/32* | (2006.01) | |
| *G02F 1/1368* | (2006.01) | |
| *H01L 51/52* | (2006.01) | |
| *G02F 1/1333* | (2006.01) | |
| *H01L 29/786* | (2006.01) | |
| *H01L 29/417* | (2006.01) | |
| *G02F 1/1343* | (2006.01) | |

(52) U.S. Cl.
CPC ....... *G09G 3/3607* (2013.01); *H01L 27/1214* (2013.01); *H01L 27/1248* (2013.01); *H01L 27/3258* (2013.01); *H01L 29/78603* (2013.01); *H01L 29/78609* (2013.01); *H01L 29/78666* (2013.01); *H01L 29/78675* (2013.01); *H01L 51/5246* (2013.01); *G02F 2001/13685* (2013.01); *G02F 2001/133311* (2013.01); *G02F 2001/133388* (2013.01); *G02F 2001/134372* (2013.01); *G02F 2202/103* (2013.01); *G09G 2300/0426* (2013.01); *G09G 2310/08* (2013.01); *H01L 29/41733* (2013.01)

(58) Field of Classification Search
CPC ........ G02F 2001/133388; G02F 2001/134372; G02F 2001/13685; G02F 2202/103; G09G 3/3607; G09G 2300/0426; G09G 2310/08; H01L 27/1214; H01L 27/1248; H01L 27/3258; H01L 29/78603; H01L 29/78609; H01L 29/78666; H01L 29/78675; H01L 51/5246; H01L 29/41733
See application file for complete search history.

(56) References Cited

U.S. PATENT DOCUMENTS

| | | |
|---|---|---|
| 2007/0279572 A1 | 12/2007 | Yonemura |
| 2008/0218838 A1 | 9/2008 | Rey-Mermets |
| 2009/0051286 A1 | 2/2009 | Yamazaki et al. |
| 2011/0068334 A1* | 3/2011 | Yamazaki ........... H01L 27/1225 257/43 |
| 2011/0080549 A1 | 4/2011 | Jung et al. |
| 2011/0249207 A1* | 10/2011 | Segawa ............. G02F 1/134363 349/33 |

FOREIGN PATENT DOCUMENTS

| | | |
|---|---|---|
| JP | 08-234215 | 9/1996 |
| JP | 10-010544 | 1/1998 |
| JP | 10-111515 | 4/1998 |
| JP | H10-232404 | 9/1998 |
| JP | 2004-053815 | 2/2004 |
| JP | 2004-134788 | 4/2004 |
| JP | 2005-078946 | 3/2005 |
| JP | 2005-150105 | 6/2005 |
| JP | 2005-302707 | 10/2005 |
| JP | 2006-184671 | 7/2006 |
| JP | 2007-328027 | 12/2007 |
| JP | 2009-128678 | 6/2009 |
| JP | 2011-100041 | 5/2011 |
| KR | 10-2004-0061426 | 7/2004 |

OTHER PUBLICATIONS

Japanese Office Examination Report issued in connection with related Japanese Patent Application No. JP 2011-127599 dated Dec. 24, 2014 with English translation.
Korean Office Action received in corresponding Korean Patent Application No. 10-2018-0118748 dated Oct. 31, 2018 with English translation.
Korean Office Action issued in related Korean Patent Application No. 10-2012-0047310 dated Aug. 9, 2018 with English translation.
Korean Office Action issued in related Korean Application No. 10-2019-0057525 dated May 27, 2019 with English translation.
Korean Office Action received for related Korean Patent Application No. 10-2019-0141658 dated Nov. 28, 2019 with English translation.

\* cited by examiner

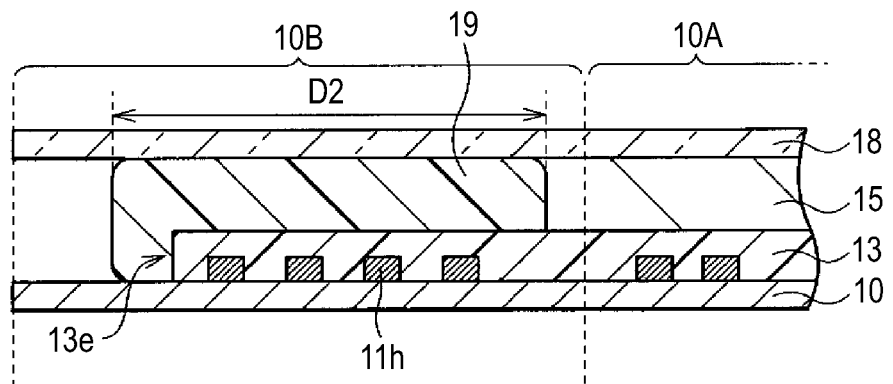
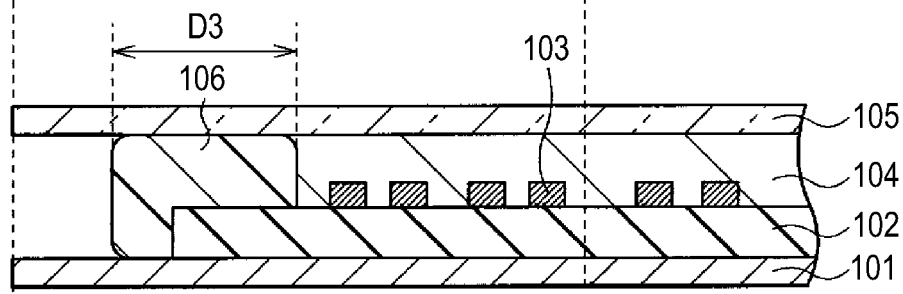
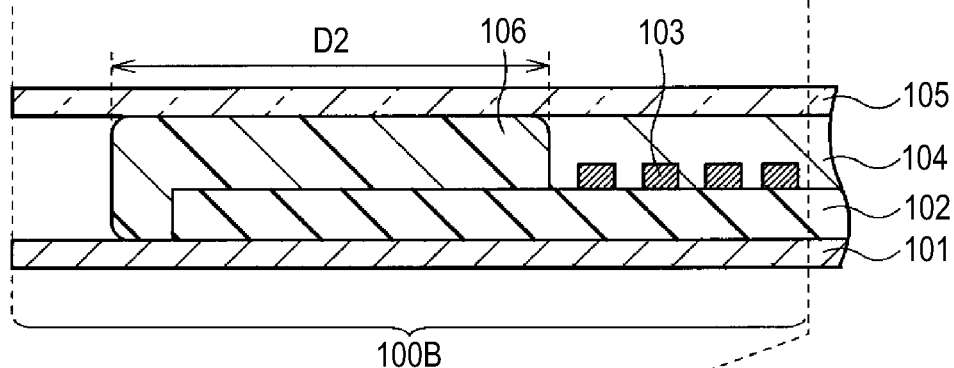
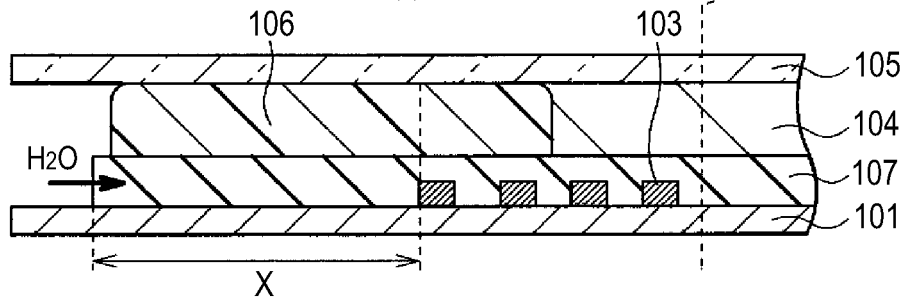

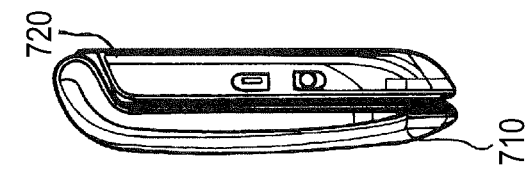
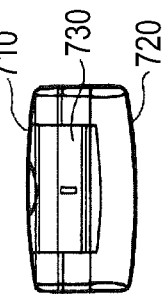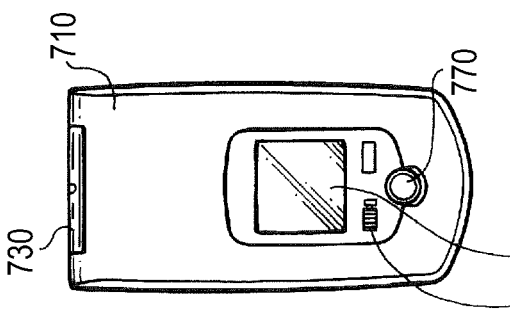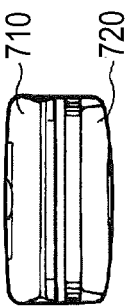
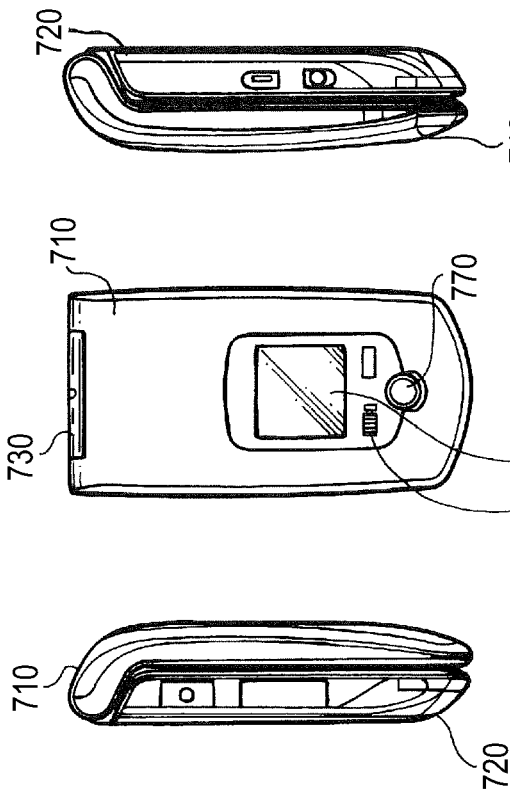
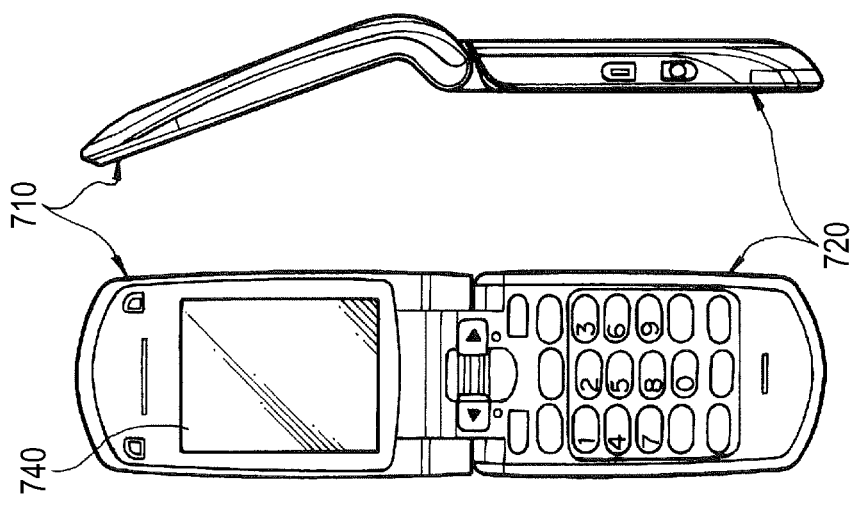

DISPLAY DEVICE AND ELECTRONIC APPARATUS

RELATED APPLICATION DATA

This application is a continuation of U.S. patent Ser. No. 15/799,074 filed Oct. 31, 2017, which is a continuation of U.S. patent application Ser. No. 15/075,302 filed Mar. 21, 2016, now U.S. Pat. No. 9,835,905 issued Dec. 5, 2017, which is a continuation of U.S. patent application Ser. No. 14/566,169 filed Dec. 10, 2014, now U.S. Pat. No. 9,323,109 issued Apr. 26, 2016, which is a continuation of U.S. patent application Ser. No. 13/485,618 filed May 31, 2012, now U.S. Pat. No. 8,982,306 issued Mar. 17, 2015 the entireties of which are incorporated herein by reference to the extent permitted bylaw. The present application claims the benefit of priority to Japanese Patent Application No. JP 2011-127599 filed on Jun. 7, 2011 in the Japan Patent Office, the entirety of which is incorporated by reference herein to the extent permitted by law.

FIELD

The present disclosure relates to a display device including a display component and a driving component packaged between panel substrates.

BACKGROUND

In a liquid crystal display device or a video display device such as an organic electro luminescence (hereinafter referred to as EL) display device, when moisture intrudes into a display panel, characteristics of a liquid crystal layer and an organic EL layer are deteriorated or corrosion occurs in wiring layers and the like. Therefore, the display device includes a structure in which the periphery of the display panel is bonded and sealed by a seal material or the like. Various proposals have been made concerning such a sealing structure for the display panel (JP-A-2005-78946 and JP-A-1-239528).

For example, JP-A-2005-78946 and JP-A-1-239528 propose a method of sealing, with the seal material, the periphery of a display panel including a structure in which electrodes, a light emitting layer, and the like are laminated on a substrate on which thin film transistors (TFTs) for driving peripheral circuits and pixels are provided.

SUMMARY

In the display device explained above, the TFTs are disposed in a display region (an effective display region) and a peripheral region (a frame region) of the display region as driving components for the pixels and the peripheral circuits. However, the method disclosed in JP-A-2005-78946 adopts a sealing structure in which such TFTs are provided on a planarization film formed of an inorganic insulating film and the seal material is provided to surround the further outer side of the TFTs. In order to impart sufficient sealing performance to the sealing structure, it is necessary to secure the width of the seal material to some extent. Therefore, in such a sealing structure in which the seal material is provided on the outer side of the TFTs, it is difficult to realize a reduction in the width of the frame of the panel.

Therefore, it is desirable to provide a display device and an electronic apparatus that can realize the reduction in the width of the frame without reducing the sealing performance.

An embodiment of the present disclosure is directed to a display device including: a pixel section provided between a pair of substrates and including plural pixels; one or plural active components disposed in a frame region around the pixel section on one substrate of the pair of substrates; an insulating film provided in the frame region on the one substrate to cover the one or plural active components; and a sealing layer provided to seal the pixel section and cover an end edge portion of the insulating film in the frame region.

In the display device according to the embodiment, the insulating film is provided between the pair of substrates to cover the one or plural active components disposed in the frame region of the pixel section. The sealing layer is provided to seal the pixel section in the frame region and cover the end edge portion of the insulating film. Consequently, it is possible to suppress intrusion of moisture and the like into the active components and the pixel section while realizing a reduction in a space in the frame region.

Another embodiment of the present disclosure is directed to an electronic apparatus including the display device according to the embodiment.

With the display device according to the embodiment, the insulating film is provided between the pair of substrates to cover the one or plural active components disposed in the frame region of the pixel section. The sealing layer is provided to seal the pixel section in the frame region and cover the end edge portion of the insulating film. Consequently, it is possible to realize a reduction in the width of the frame without reducing sealing performance.

BRIEF DESCRIPTION OF THE DRAWINGS

FIGS. 3A to 3D are sectional views for explaining areas of frames of liquid crystal display devices according to comparative examples 1 and 2 and the first embodiment;

FIG. 16 is a plan view of a schematic configuration of a module including the display device according to each of the embodiments and the like;

FIG. 21A is a front view of an application example 5 in an opened state;

FIG. 21B is a side view the application example 5 in the opened state;

FIG. 21C is a front view of the application example 5 in a closed state;

FIG. 21D is a left side view of the application example 5 in the closed state;

FIG. 21E is a right side view of the application example 5 in the closed state;

FIG. 21F is a top view of the application example 5 in the closed state; and

FIG. 21G is a bottom view of the application example 5 in the closed state.

DETAILED DESCRIPTION

Exemplary embodiments of the present disclosure are explained below in detail with reference to the accompanying drawings. The explanation is made in the order described below.

1. First Embodiment (an example of a liquid crystal display device including a sealing structure in which an end edge portion of a seal layer is provided further on the outer side than an end edge portion of a planarization film that covers TFTs (a bottom gate structure formed of low-temperature polysilicon))

2. Second Embodiment (an example in which a protective film is provided between a seal layer and a planarization film)

3. Modification 1 (another example in which the protective film is provided between the seal layer and the planarization film)

4. Third Embodiment (an example of a liquid crystal display device display-driven according to an FFS mode)

5. Modification 2 (an example in which an insulating film and a protective film provided between a pair of electrodes are pattern-formed in the same process in the liquid crystal display device of the FFS mode)

6. Modification 3 (an example in which the insulating film provided between the pair of electrodes is formed to be extended to a frame and used as the protective film in the liquid crystal display device of the FFS mode)

7. Modification 4 (an example in which an electrode protecting film is provided on TFTs (a bottom gate structure)

8. Modification 5 (an example in which transistors of a top gate structure are provided as the TFTs)

9. Modification 6 (an example in which the electrode protecting film is provided on the TFTs (the top gate structure)

10. Modification 7 (an example in which amorphous silicon is used as the TFTs)

11. Modification 8 (an example in which a recess is provided in a planarization film in a frame region)

12. Modification 9 (another example in which the recess is provided)

13. Modification 10 (an example in which a seal layer covers an end edge portion of a planarization film on an opposed substrate side)

14. Application examples (application examples to electronic apparatuses)

First Embodiment

[Configuration Example of a Liquid Crystal Display Device 1A]

Figure 1:
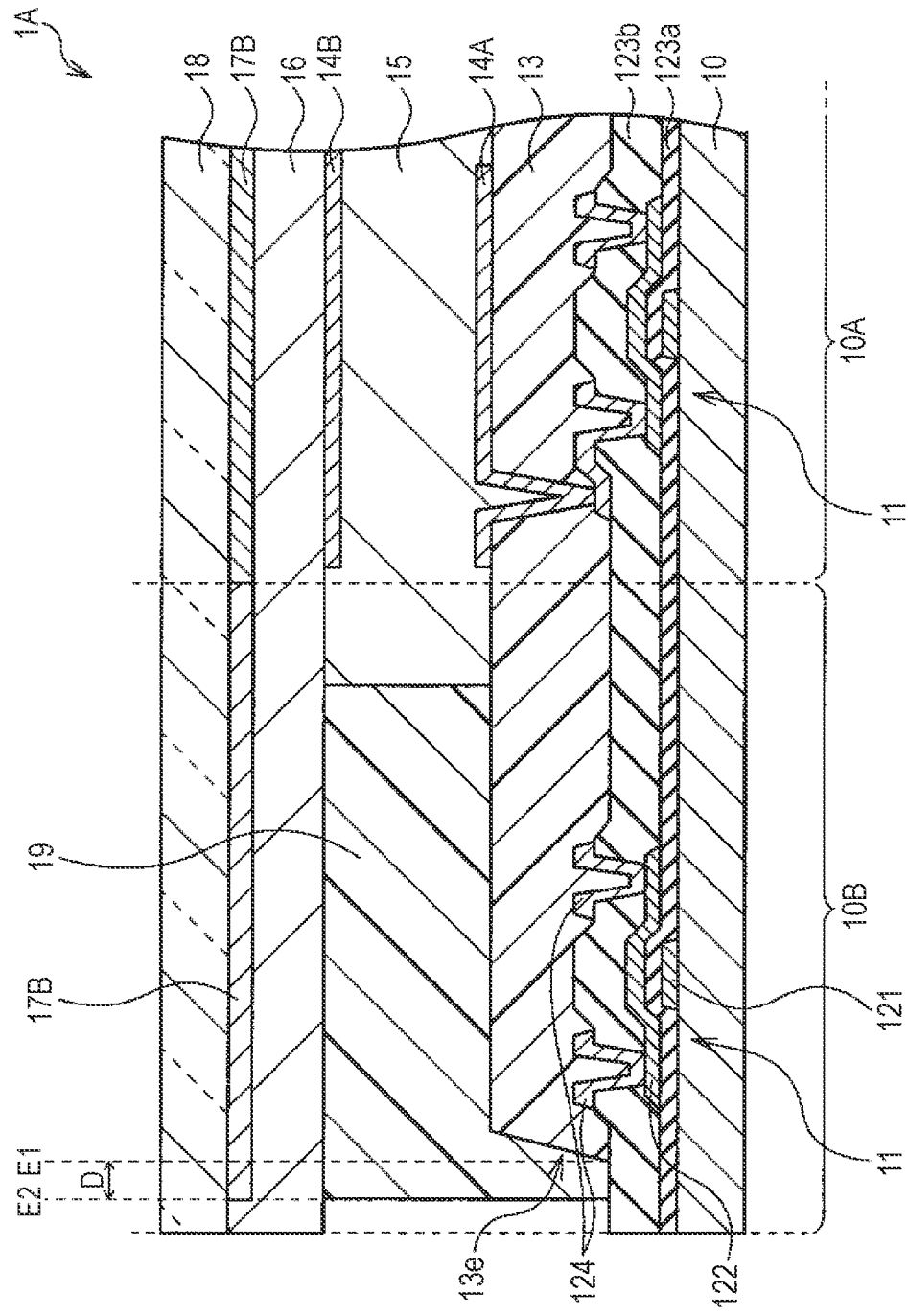
FIG. 1 is a sectional view of a schematic configuration of the vicinity of a boundary between a pixel section and a frame section of a liquid crystal display device (a liquid crystal display panel) according to a first embodiment in the present disclosure.

FIG. 1 is a diagram of a sectional structure (a sectional structure of the vicinity of a boundary between a pixel section 10A and a frame region 10B) of a liquid crystal display device 1A according to a first embodiment of the present disclosure. In the liquid crystal display device 1A, the pixel section 10A is sealed between a pair of substrates (a driving side substrate 10 and an opposed substrate 18) in a display panel. In the pixel section 10A, for example, plural pixels (e.g., sub-pixels of R (red), G (green), and B (blue)) are arranged in a matrix shape. Although not shown in FIG. 1, a backlight is disposed below the driving side substrate 10. Polarizing plates are respectively stuck to a light incident side of the driving side substrate 10 and a light emission side of the opposed substrate 18 (the same applies in other embodiments). The liquid crystal display device 1A includes a structure in which the pixel section 10A is bonded and sealed by a seal layer 19 (a sealing layer) in the frame region 10B around the pixel section 10A. In this embodiment, a liquid crystal display device display-driven according to a so-called longitudinal electric field mode is explained.

In the liquid crystal display device 1A, plural TFTs 11, wiring layers (signal lines, scanning lines, etc.), a storage capacity component (not shown) and the like are disposed from the pixel section 10A to the frame region 10B on the driving side substrate 10. A planarization film 13 is provided to cover the TFTs 11 and the like. In the pixel section 10A, plural pixel electrodes 14A are disposed on the planarization film 13. Each of the pixel electrodes 14A is electrically connected to the TFTs 11 in a lower layer via contact holes provided in the planarization film 13. A color filter 17A and a light blocking layer 17B are provided on one surface side of the opposed substrate 18. The color filter 17A and the light blocking layer 17B are covered with a planarization film 16. An opposed electrode 14B is disposed on the planarization film 16. A liquid crystal layer 15 is held between the driving side substrate 10 and the opposed substrate 18. A voltage is supplied to the liquid crystal layer 15 through the pixel electrodes 14A and the opposed electrode 14B. Not-shown oriented films are respectively formed on the surfaces on the liquid crystal layer 15 side of the pixel electrodes 14A and the opposed electrode 14B.

The driving side substrate 10 is formed of, for example, a glass substrate. On the driving side substrate 10, the pixel section 10A explained above is provided. In the frame region 10B around the pixel section 10A, peripheral circuits (e.g., a signal line driving circuit 61, a scanning line driving circuit 62, a backlight driving unit 63, and a timing control unit 64 explained below) for display-driving the pixel section 10A are disposed.

The TFTs 11 are, for example, thin film transistors of a bottom gate type (a reverse stagger type). Specifically, in the TFTs 11, gate electrodes 121 are disposed on the driving side substrate 10. On the gate electrodes 121, semiconductor layers 122 are provided via an inter-layer insulating film 123a (a gate insulating film). On the semiconductor layers 122, an interlayer insulating film 123b is laminated. Source/drain electrodes 124 are disposed to fill contact holes formed in the interlayer insulating film 123b.

The gate electrodes 121 control carrier density in the semiconductor layers 122 according to a gate voltage (Vg) applied to the transistor and has a function of a wire for supplying potential. The gate electrodes 121 are laminated films formed of a simple substance or an alloy including one kind of, for example, molybdenum (Mo), titanium (Ti), aluminum (Al), silver (Ag), and copper (Cu) or laminated films including two or more kinds of these substances. Alternatively, the gate electrodes 121 may be formed of transparent conductive films such as ITO (indium tin oxide), AZO (aluminum-doped zinc oxide), or GZO (gallium-doped zinc oxide).

The interlayer insulating films 123a and 123b are single layer films formed of one kind of, for example, a silicon oxide film ($SiO_2$), a silicon nitride film (SiN), and a silicon nitride oxide film (SiON) or laminated films formed of two or more kinds of these films.

The semiconductor layers 122 form channels according to the application of a gate voltage. The semiconductor layers 122 are formed of, for example, low-temperature polysilicon. The semiconductor layers 122 are not limited to the low-temperature polysilicon. Amorphous silicon (explained below) or microcrystalline silicon may be used. An oxide semiconductor such as indium gallium zinc oxide (IGZO or InGaZnO) may be used.

The source/drain electrodes 124 function as sources or drains of the TFTs 11. The source/drain electrodes 124 are electrically connected to source regions or drain regions of the semiconductor layers 122. The source/drain electrodes 124 are simple substances or alloys including one kind of, for example, molybdenum, titanium, aluminum, silver, and copper or laminated films including two or more kinds of these substances. Signal lines (signal lines DTL explained below) are electrically connected to the source/drain electrodes 124 (or the source/drain electrodes 124 function as signal lines). In this embodiment, the planarization film 13 is provided to cover such signal lines and the TFTs 11 (the signal lines and the TFTs 11 are disposed in a layer lower than the planarization film 13).

The planarization film 13 is formed of an organic insulating film having photosensitivity such as polyimide, Novorlac resin, or acrylic resin. The planarization film 13 is formed from the pixel section 10A to the frame region 10B on the driving side substrate 10 and covers the TFTs 11 disposed in both the pixel section 10A and the frame region 10B. In other words, in the frame region 10B, the planarization film 13 is laminated on the TFTs 11. In this embodiment, the seal layer 19 is provided to cover an end edge portion 13e of the planarization film 13.

The seal layer 19 is formed of a resin material having adhesiveness and having low moisture permeability, for example, epoxy resin or acrylic resin having UV curability or thermosetting property. The seal layer 19 is formed by, for example, applying and forming the resin material on the frame region 10B on the driving side substrate 10 using, for example, various coating methods and then hardening the resin material. In this embodiment, in the frame region 10B, an end edge E2 of the seal layer 19 is provided further on the outer side than an end edge E1 of the planarization film 13 (on the opposite side of the pixel section 10A). In other words, a sealing structure is formed to prevent the end edge portion 13e of the planarization film 13 formed of the organic insulating film from being exposed to the outside.

The pixel electrodes 14A are electrodes for applying video potentials corresponding to video signals of each of colors to each of pixels. The pixel electrode 14A is disposed for each of the pixels. The pixel electrodes 14A are formed of transparent conductive films of ITO or the like. The opposed electrode 14B is provided as an electrode common to each of the pixels to be opposed to the plural pixel electrodes 14A. For example, common potential is applied by the opposed electrode 14B.

The liquid crystal layer 15 is a component that controls, according to a driving voltage supplied through the pixel electrodes 14A and the opposed electrode 14B, the transmittance of light transmitted through the liquid crystal layer 15. The liquid crystal layer 15 includes liquid crystal display-driven according to a longitudinal electric field mode such as a VA (Vertical alignment) mode, a TN (Twisted nematic) mode, or an ECB (Electrically controlled birefringence) mode. As the oriented films, for example, when the liquid crystal of the VA mode is used as the liquid crystal layer 15, for example, a vertical oriented film formed of polyimide is used.

The planarization film 16 is formed of, for example, an organic insulating film. The planarization film 16 has a function of a protective film for the color filter 17A and the light blocking layer 17B together with a planarization function. However, the planarization film 16 is not limited to such an organic insulating film and may be formed of an inorganic insulating film.

The color filter 17A and the light blocking film 17B include, for example, photosensitive resin and a coloring material such as a pigment or a dye. As the color filter 17A, for example, a filter of any one of red, green, and blue is provided for each of the pixels. The opposed substrate 18 is formed of a transparent substrate of, for example, glass or plastics.

A pair of polarizing plates (polarizer or analyzer) not shown in the figure are arranged in a state of cross Nichol each other. The polarizing plates are configured to block light from a backlight (a backlight 36 explained below) in a voltage non-applied state (an OFF state) and transmit the light in a voltage applied state (an ON state).

(Peripheral Circuits)

Figure 2:
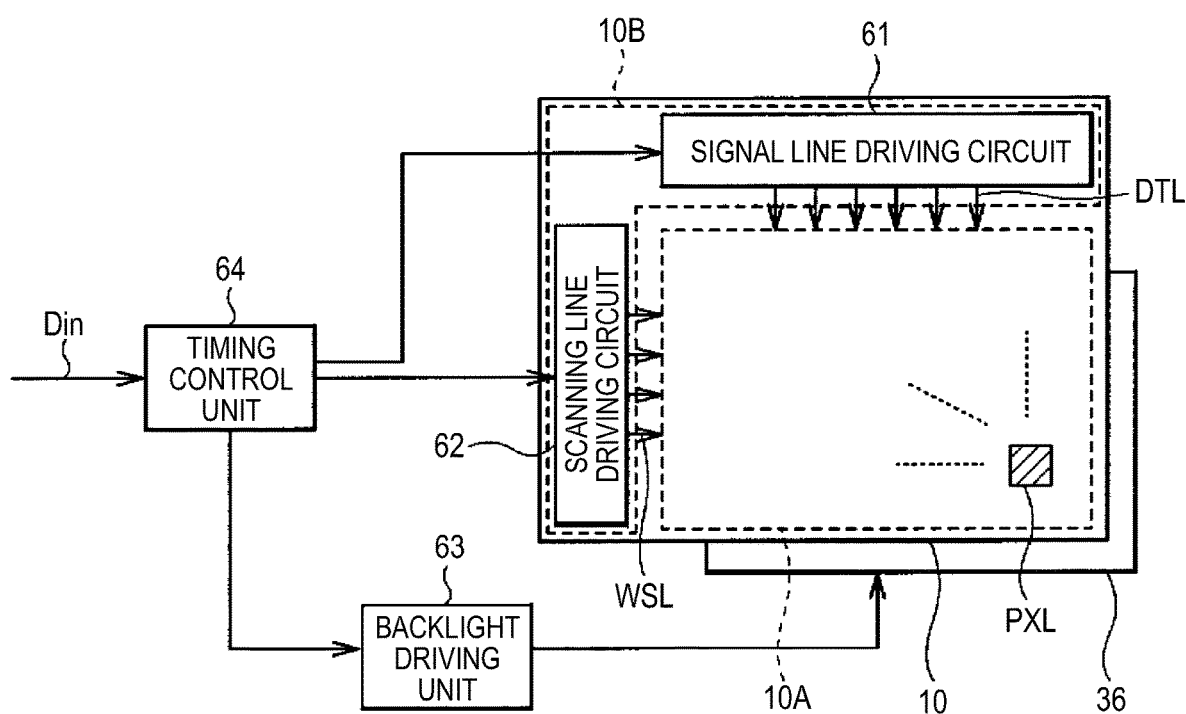
FIG. 2 is a functional block diagram of an example of peripheral circuits in the liquid crystal display device shown in FIG. 1.

FIG. 2 is a diagram of the configuration of the pixel section 10A including pixels (PXL) including liquid crystal display components and the peripheral circuits of the pixel section 10A. As shown in the figure, in the pixel sections 10A on the driving side substrate 10, plural pixels (PXL) are two-dimensionally arranged in, for example, a matrix shape. In the frame region 10B around the pixel section 10A, for example, the scanning line driving circuit 62 and the signal line driving circuit 61 are disposed. Besides, for example, the timing control unit 64, the backlight driving unit 63, and a video signal processing circuit that applies predetermined correction processing to a video signal are provided. The pixels (PXL) are connected to scanning lines WSL and signal lines DTL.

The timing control unit 64 controls driving timing of the scanning line driving circuit 62 and the signal line driving circuit 61 and supplies an input video signal Din to the signal line driving circuit 61. The scanning line driving circuit 62 line-sequentially drives the pixels according to the timing control by the timing control unit 64. The signal line driving circuit 61 supplies a video voltage based on the video signal Din, which is supplied from the timing control unit 64, to the pixels. Specifically, the signal line driving circuit 61 applies D/A (digital/analog) conversion to the video signal Din to thereby generate an analog video signal and outputs the analog video signal to the pixels.

The backlight 36 is a light source that irradiates light toward the liquid crystal layer 15. The backlight 36 includes, for example, plural LEDs (light emitting diodes) or CCFLs (cold cathode fluorescent lamps). The backlight 36 is driven by the backlight driving unit 63 and controlled to be in a lit state and a lit-out state.

(Operation and Advantage)

In the liquid crystal display device 1A, as shown in FIG. 2, when an external input signal (Din) is input to the timing control unit 64, the scanning line driving circuit 62 and the signal line driving circuit 61 display-drive the pixels (PXL) of the pixel section 10A. Specifically, according to the control by the timing control unit 61, the scanning line driving circuit 62 sequentially supplies scanning signals to the scanning lines WSL connected to each of the pixels and the signal line driving circuit 61 supplies a video signal based on the external input signal (Din) to a predetermined signal line DTL. Consequently, pixels located in crossing points of the signal line DTL to which the video signal is supplied, and the scanning lines WSL to which the scanning signals are supplied are selected. A driving voltage is applied to the pixels.

In the pixels selected as explained above, the driving voltage is supplied through the pixel electrodes 14A and the opposed electrode 14B, whereby an oriented state of liquid crystal molecules in the liquid crystal layer 15 changes according to the magnitude of the driving voltage. As a result, optical characteristics in the liquid crystal layer 15 change. Light made incident on the liquid crystal layer 15 from the backlight 36 is modulated for each of the pixels and is emitted onto the opposed substrate 18. In the liquid crystal display device 1A, a video is displayed in this way.

The liquid crystal display device 1A includes the structure in which the pixel section 10A is sealed in the periphery in the frame region 10B. In this embodiment, the pixel section 10A is sealed by the seal layer 19 in the frame region 10B. In the frame region 10B, the TFTs 11 are disposed and the planarization film 13 is formed to cover the TFTs 11. In such a configuration, the end edge portion 13e of the planarization film 13 is covered with the seal layer 19 (the end edge E2 of the seal layer 19 is provided further on the outer side than the end edge E1 of the planarization film 13). Consequently, it is possible to reduce a space of the frame region 10B without reducing sealing performance. A reason for this is explained below.

FIGS. 3A to 3D are sectional schematic views for explaining differences in sealing performance and an area of a frame due to a layout of the wiring layers (the signal lines) and the seal layer in the frame region. In FIG. 3A, a layout configuration in this embodiment is shown in a simplified form. In FIGS. 3B and 3C, a liquid crystal display device according to a comparative example 1 is shown. In FIG. 3D, a liquid crystal display device according to a comparative example 2 is shown.

As shown in FIG. 3B, in the liquid crystal display device according to the comparative example 1, a planarization film 102 formed of an inorganic insulating film is provided on a substrate 101. In the planarization film 102, plural TFTs (not shown) are embedded (or the plural TFTs are provided in a layer lower than the planarization film 102). The plural TFTs are respectively electrically connected to signal lines 103. In the comparative example 1, the signal lines 103 are disposed on the planarization film 102. In the comparative example 1, a seal layer 106 is formed to surround the further outer side of the TFTs and the signal lines 103 provided in a frame region 100B (a peripheral circuit including the TFTs and the signal lines 103 may be unable to be formed under the seal layer 106). In such a case, it is likely that width (hereinafter referred to as seal width) D3 of the seal layer 106, which can be formed in the frame region 100B, is relatively small and sufficient sealing performance is not obtained.

On the other hand, as shown in FIG. 3C, in the structure of the comparative example 1, if the seal width of the seal layer 106 is increased in order to obtain the sufficient sealing performance, the area (the width) of the frame region 100B also increases according to the increase of the seal width.

On the other hand, as shown in FIG. 3D, in the liquid crystal display device according to the comparative example 2, the signal lines 103 respectively connected to the plural TFTs (not shown) are provided on the substrate 101. A planarization film 107 formed of an organic insulating film is formed to cover the plural TFTs and the signal lines 103. The seal layer 106 is formed on the planarization film 107. In the comparative example 2 including such a structure, since moisture tends to intrude from an end of the planarization film 107, it is necessary to secure width X equal to or larger than fixed width at the end of the planarization film 107 in order to prevent corrosion. Therefore, the frame region tends to be large.

On the other hand, in this embodiment, as shown in FIG. 3A, the planarization film 13 is provided to cover plural TFTs (not shown) disposed on the driving side substrate 10 and signal lines 11h electrically connected to the TFTs. The seal layer is formed to cover the end edge portion 13e of the planarization film 13. Specifically, the TFTs and the signal lines 11h are provided in a layer lower than the planarization film 13 and the planarization film 13 is further covered with the seal layer 19 having high sealing performance (low moisture permeability). The planarization film 13 is formed of an organic insulating film that more easily allows moisture to permeate than an inorganic insulating film. However, since the entire surface on the outermost side of the panel is sealed by the seal layer 19, even if the TFTs and the signal lines 11h are provided in a region close to the outer side of the panel, the electrodes and the wiring section are less easily corroded by moisture. Further, since the seal width is sufficiently secured, deterioration in a liquid crystal retention property in the liquid crystal layer 15 is suppressed. Specifically, for example, in the peripheral region of the pixel section 10A, it is possible to provide the TFTs 11 and the driving circuits (the scanning line driving circuit 62, the signal line driving circuit 61, etc. explained above) including the wiring layers (the scanning lines, the signal lines, etc.) closer to the outer edge of the panel (effectively utilize the space under the seal layer 19) and reduce the width of the frame region 10B. In this way, in the liquid crystal display device 1A, it is possible to realize a reduction in a space of the frame region 10B while preventing intrusion of moisture.

As explained above, in this embodiment, between the driving side substrate 10 and the opposed substrate 18, the planarization film 13 is provided to cover the TFTs 11 disposed in the frame region 10B and the seal layer 19 that seals the pixel section 10A is provided to cover the end edge portion 13e of the planarization film 13. Consequently, in the liquid crystal display device 1A, it is possible to realize a reduction in a space of the frame region 10B while suppressing corrosion of the wiring layers and deterioration in the liquid crystal retention property due to intrusion of moisture. Therefore, it is possible to realize a reduction in the width of the frame without reducing the sealing performance.

A liquid crystal display device (a liquid crystal display device 1B) according to a second embodiment of the present disclosure is explained below. In the following explanation, components same as the components of the liquid crystal display device 1A according to the first embodiment are denoted by the same reference numerals and signs and explanation of the components is omitted as appropriate.

Second Embodiment

Figure 4:
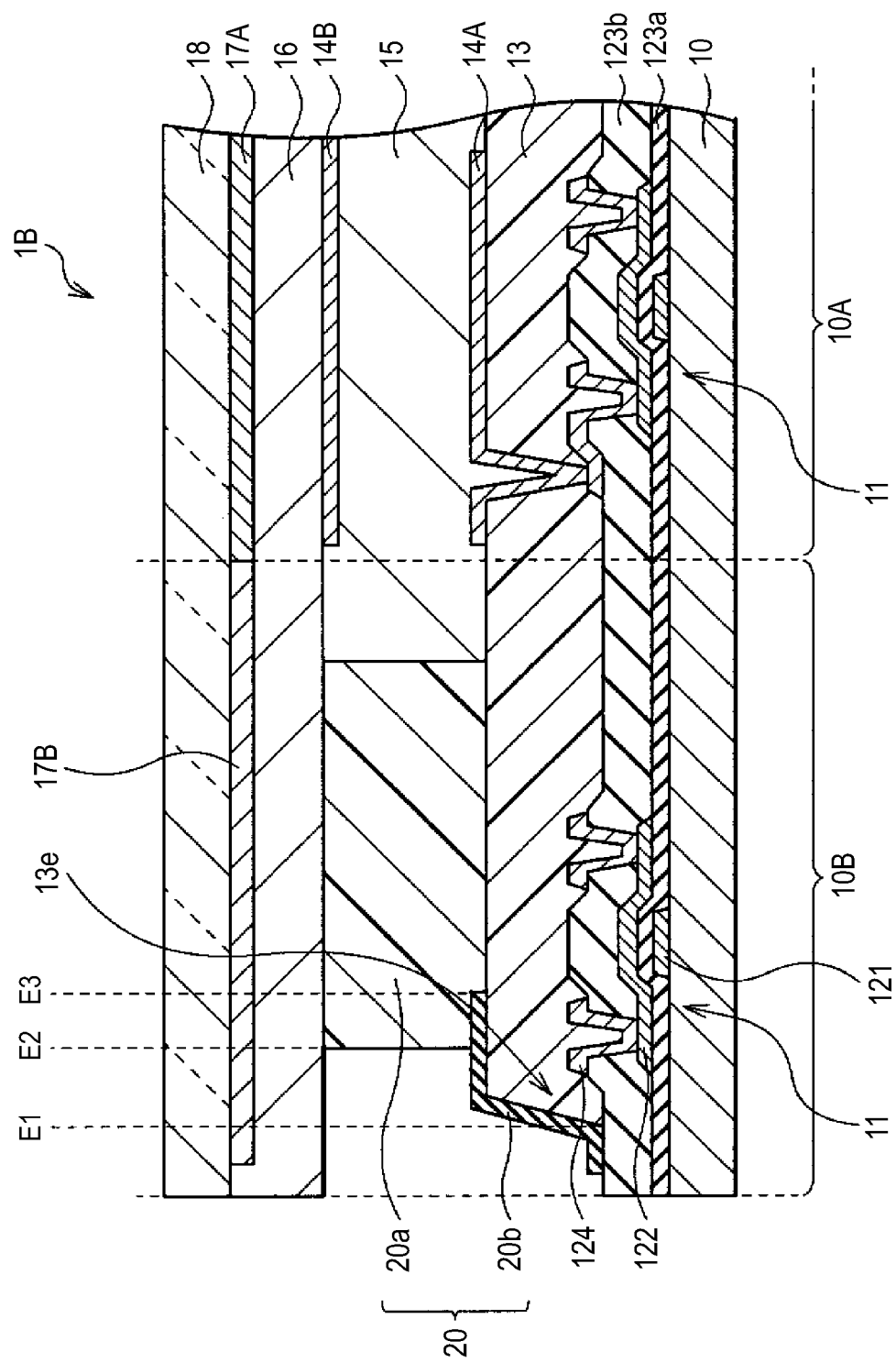
FIG. 4 is a sectional view of a schematic configuration of the vicinity of a boundary between a pixel section and a frame section of a liquid crystal display device according to a second embodiment in the present disclosure.

FIG. 4 is a diagram of a sectional structure (a sectional structure of the vicinity of a boundary between the pixel section 10A and the frame region 10B) of the liquid crystal display device 1B. In the liquid crystal display device 1B, as in the liquid crystal display device 1A according to the first embodiment, the pixel section 10A is sealed between the driving side substrate 10 and the opposed substrate 18 in the display panel. Like the liquid crystal display device 1A, the liquid crystal display device 1B includes a structure in which the pixel section 10A is bonded and sealed by a sealing layer 20 in the frame region 10B. On the driving side substrate 10, the plural TFTs 11 are disposed from the pixel section 10A to the frame region 10B. The planarization film 13 is provided to cover the TFTs 11. However, in this embodiment, the sealing layer 20 includes a laminated structure of a seal layer 20a and a protective film 20b. The configuration of peripheral circuits that drive the pixel section 10A is the same as the configuration in the first embodiment.

Like the seal layer 19 in the first embodiment, the seal layer 20a is formed of a resin material having adhesiveness and having low moisture permeability, for example, epoxy resin or acrylic resin having UV curability or thermosetting property. At least a part of the seal layer 20a is provided to be superimposed on the protective film 20b.

The protective film 20b is formed of an inorganic insulating film such as a silicon oxide film, a silicon nitride film, or a silicon oxide nitride film. The protective film 20b is provided to cover the end edge portion 13e of the planarization film 13. The protective film 20b only has to cover at least the end edge portion 13e of the planarization film 13 and does not have to cover the entire surface on the planarization film 13.

In the first embodiment, the end edge E2 of the seal layer 19 is provided further on the outer side than the end edge E1 of the planarization film 13. However, in this embodiment, the end edge E2 of the seal layer 20a is provided further on the inner side than the end edge E1 of the planarization film 13. However, the end edge E2 of the seal layer 20a is desirably provided further on the outer side than an end edge portion E3 on the inner side (the side of the pixel section 10A) of the protective film 20b. In other words, the planarization film 13 is desirably covered with one or both of the seal layer 20a and the protective film 20b.

In this embodiment, as in the first embodiment, the planarization film 13 is provided to cover the TFTs 11 disposed in the frame region 10A on the driving side substrate 10. The sealing layer 20 is provided to cover the end edge portion 13e of the planarization film 13. Since the entire surface on the outmost side of the panel is sealed by the sealing layer 20 in this way, even if the TFTs 11 are provided in a region close to the outer side of the panel, the electrodes and the wiring sections are less easily corroded by moisture. Further, since the seal width in the sealing layer 20 (the seal layer 20a) can be sufficiently secured, deterioration in a liquid crystal retention property in the liquid crystal layer 15 is suppressed. Therefore, in the liquid crystal display device 1B according to this embodiment, as in the first embodiment, it is possible to realize a reduction in the width of the frame without reducing sealing performance.

In this embodiment, the sealing layer 20 includes a laminated structure of the seal layer 20a and the protective film 20b. The protective film 20b covers the end edge portion 13e of the planarization film 13. Since the protective film 20b formed of the inorganic resin film is provided in the lower layer of the seal layer 20a, even if there is variation in a setting area of the seal layer 20a, intrusion of moisture into the planarization film 13 is suppressed. Since the seal layer 20a is applied and formed as explained above, variation tends to occur in the seal width. However, even if such variation occurs, it is possible to prevent the end edge portion 13e of the planarization film 13 from being exposed and secure substantially fixed sealing performance.

In short, even if the end edge E2 of the seal layer 20a is provided further on the inner side than the end edge E1 of the planarization film 13 (even if the seal layer 20a does not cover the end edge portion 13e of the planarization film 13) as in this embodiment, it is possible to suppress intrusion of moisture into the planarization film 13.

Modification 1

Figure 5:
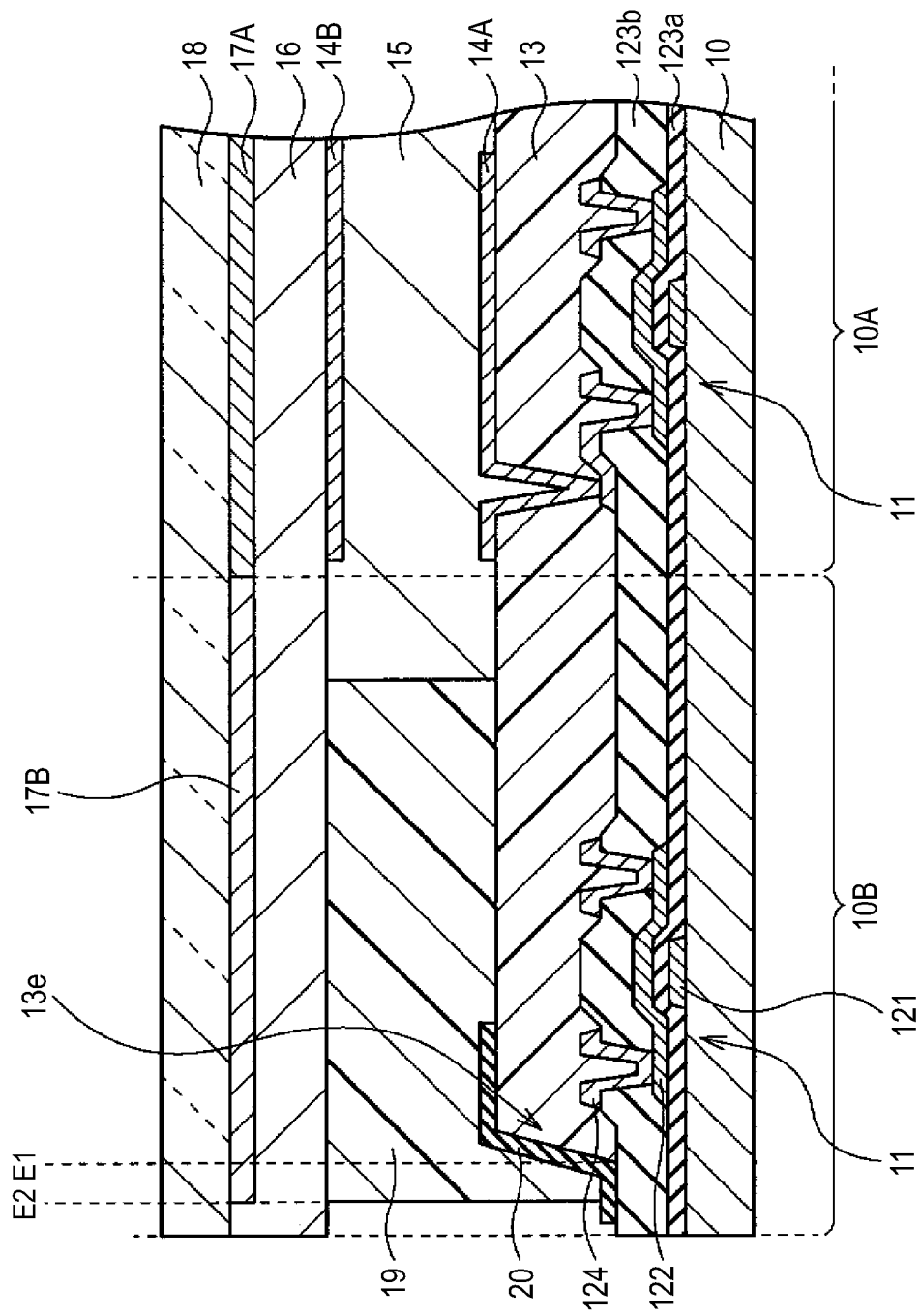
FIG. 5 is a sectional view of a schematic configuration of the vicinity of a boundary between a pixel section and a frame section of a liquid crystal display device according to a modification 1.

Alternatively, as shown in FIG. 5, in a structure including the protective film 20b, the end edge E2 of the seal layer 20a may be provided further on the outer side than the end edge E1 of the planarization film 13. The sealing performance is further improved by the laminated structure of the seal layer 20a and the protective film 20b. In the second embodiment and the modification 1 explained above, in the frame region 10B, the protective film 20b is provided to cover only a part on the planarization film 13. However, the protective film 20b may cover the entire region in the frame region 10B on the planarization film 13.

A liquid crystal display device (a liquid crystal display device 1C) according to a third embodiment of the present disclosure is explained. In the following explanation, components same as the components of the liquid crystal display device 1A according to the first embodiment are denoted by the same reference numerals and signs and explanation of the components is omitted as appropriate.

Third Embodiment

Figure 6:
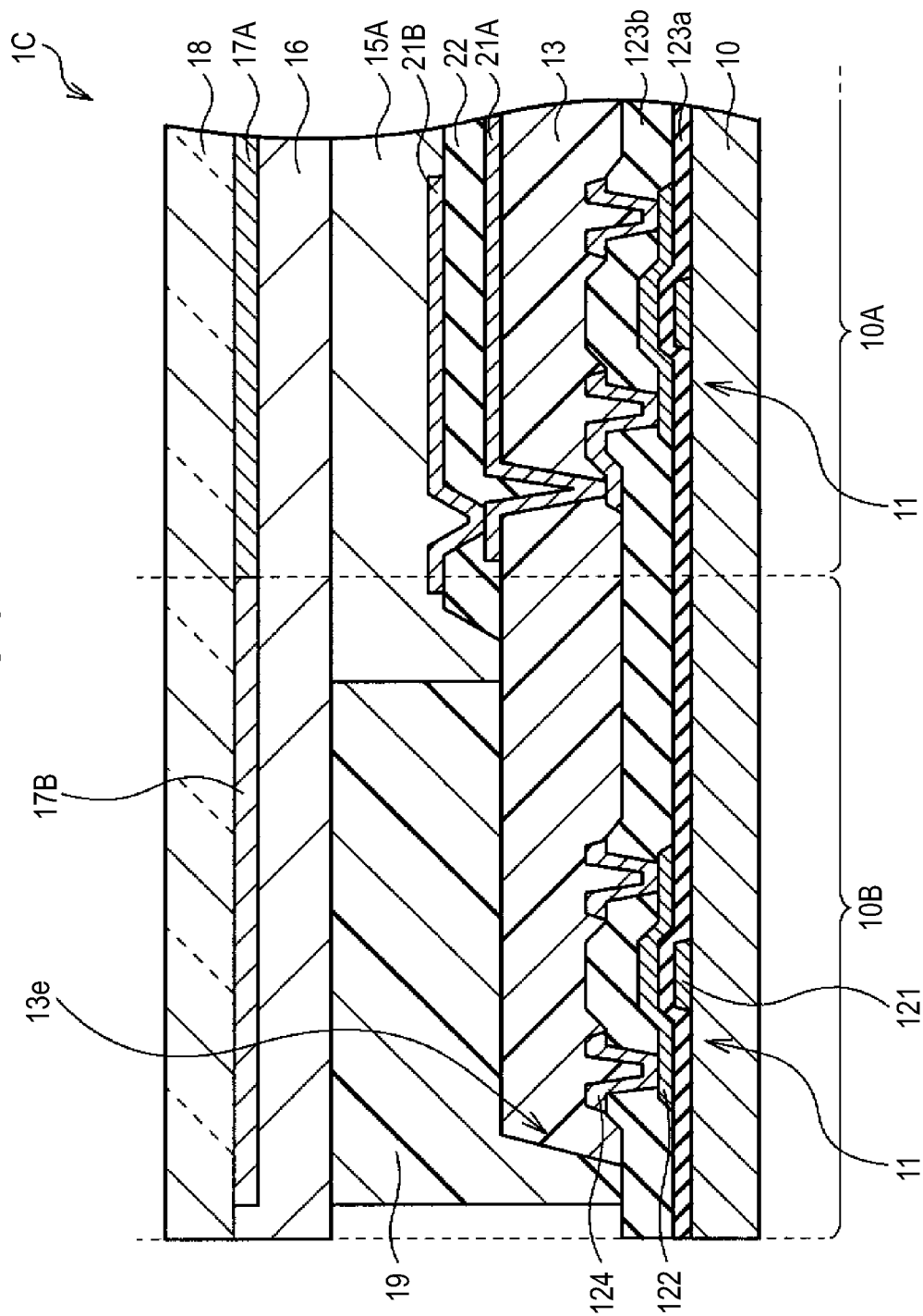
FIG. 6 is a sectional view of a schematic configuration of the vicinity of a boundary between a pixel section and a frame section of a liquid crystal display device according to a third embodiment in the present disclosure.

FIG. 6 is a diagram of a sectional structure (a sectional structure of the vicinity of the boundary between the pixel section 10A and the frame region 10B) of the liquid crystal display device 1C. In the liquid crystal display device 1C, as in the liquid crystal display device 1A according to the first embodiment, the pixel section 10A is sealed between the driving side substrate 10 and the opposed substrate 18 in the display panel. Like the liquid crystal display device 1A, the liquid crystal display device 1C includes a structure in which the pixel section 10A is bonded and sealed by the seal layer 19 in the frame region 10B. On the driving side substrate 10, the plural TFTs 11 are disposed from the pixel section 10A to the frame region 10B. The planarization film 13 is provided to cover the TFTs 11. However, the liquid crystal display device 1C according to this embodiment is configured to be display-driven according to a lateral electric field mode (an FFS (Fringe Field Switching) mode is explained as an example). The configuration of peripheral circuits that drive the pixel section 10A is the same as the configuration in the first embodiment.

In such a liquid crystal display device 1C, a common electrode 21A is disposed, for example, on the planarization film 13. A pixel electrode 21B is disposed on the common electrode 21A via an insulating film 22 (an interlayer insulating film). A liquid crystal layer 15A is formed on the pixel electrode 21B and sealed by the opposed substrate 18. As in the first embodiment, on the surface on the liquid crystal layer 15A side of the opposed substrate 18, the color filter 17A, the light blocking layer 17B, and the planarization film 16 are laminated.

The liquid crystal layer 15A is a component that controls, according to a driving voltage, the transmittance of light transmitted through the component. The liquid crystal layer 15A is driven according to the FFS mode as explained above. Besides the FFS mode, liquid crystal in other lateral electric field modes such as an IPS (In Plane Switching) mode may be used. However, in the case of the IPS mode, the liquid crystal display device 1C does not have to include the insulating film 22.

The pixel electrode 21B is provided for each of pixels and electrically connected to the sources and the drains of the TFTs 11. Potential corresponding to a video signal is supplied to the pixel electrode 21B. The pixel electrode 21B is formed of a transparent conductive film of, for example, ITO or IZO and is patterned in a comb teeth shape (has plural slits). A lateral electric field is applied to the liquid crystal layer 15A via the slits of the pixel electrode 21B. The common electrode 21A is formed of a transparent conductive film of, for example, ITO or IZO and provided as an electrode common to each of the pixels.

The insulating film 22 is formed of, for example, a silicon oxide film, a silicon nitride film, or a silicon oxide nitride film.

In this embodiment, as in the first embodiment, the planarization film 13 is provided to cover the TFTs 11 disposed in the frame region 10A on the driving side substrate 10. The seal layer 19 is provided to cover the end edge portion 13e of the planarization film 13. Consequently, even if the TFTs 11 are provided in a region close to the outer side of the panel, the electrodes and the wiring sections are less easily corroded by moisture. Further, since the seal width can be sufficiently secured, deterioration in a liquid crystal retention property in the liquid crystal layer 15A is suppressed. Therefore, in the liquid crystal display device 1C display-driven according to the FFS mode as in this embodiment, as in the first embodiment, it is possible to realize a reduction in the width of the frame without reducing sealing performance.

Modification 2

Figure 7:
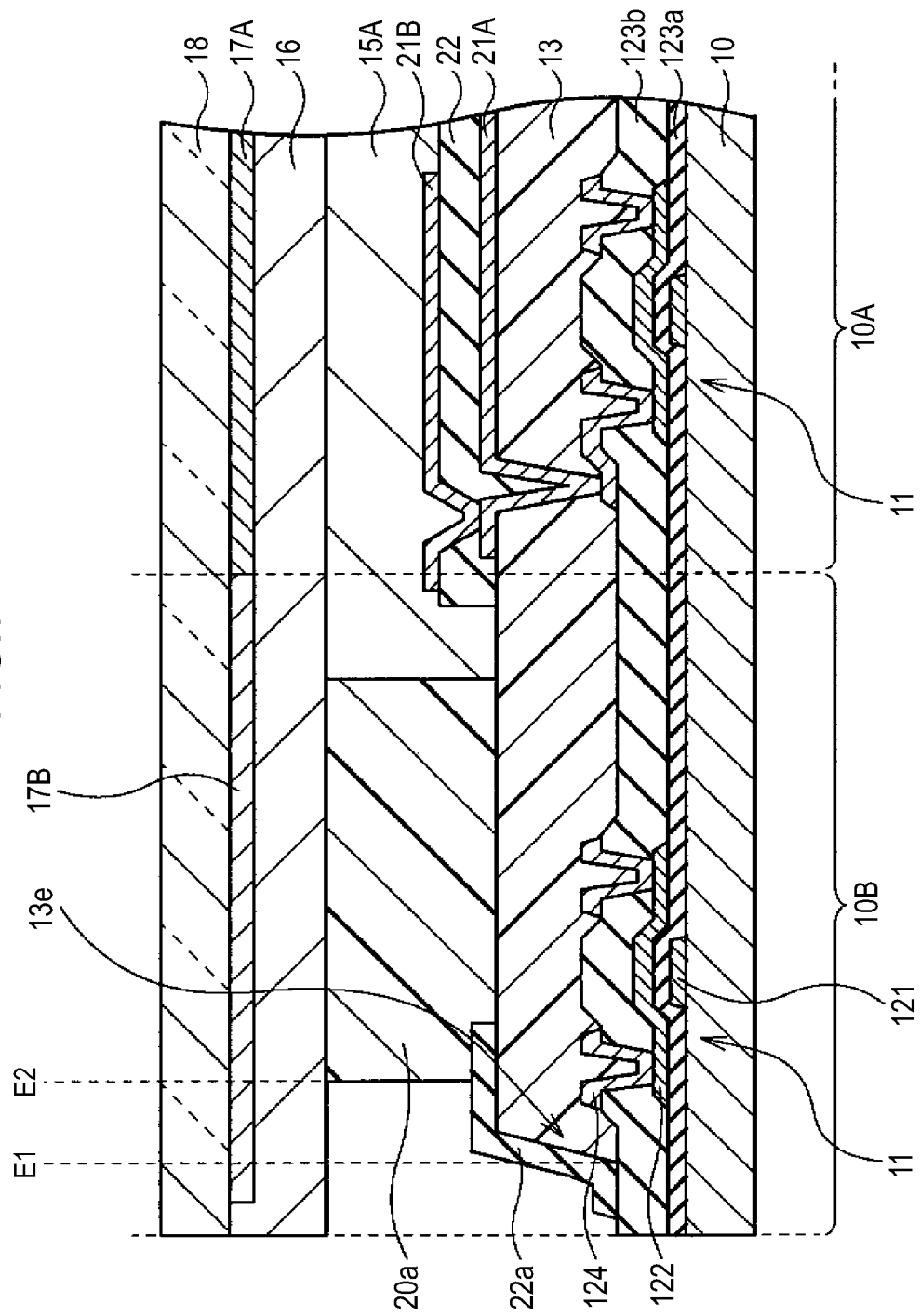
FIG. 7 is a sectional view of a schematic configuration of the vicinity of a boundary between a pixel section and a frame section of a liquid crystal display device according to a modification 2.

In the third embodiment, the liquid crystal display device display-driven according to the lateral electric field mode (the FFS mode) is explained. Such a liquid crystal display device may adopt the structure in which the protective film (the inorganic insulating film) explained in the second embodiment is provided. An example of the structure is shown in FIG. 7. As shown in the figure, a protective film 22a is provided to cover the end edge portion 13e of the planarization film 13. The seal layer 20a is provided to be superimposed on the protective film 22a. The end edge E2 of the seal layer 20a is arranged further on the inner side than the end edge E1 of the planarization film 13. However, as explained above, the end edge E2 of the seal layer 20a may be provided further on the outer side than the end edge E1 of the planarization film 13.

In the liquid crystal display device of the FFS mode, in the pixel section 10A, as explained above, the insulating film 22 formed of the inorganic insulating film is provided between the common electrode 21A and the pixel electrode 21B. Therefore, it is possible to form the protective film 22a in a process for forming the insulating film 22. Specifically, after the inorganic insulating film explained above is formed by, for example, the CVD method over the entire surface on the planarization film 13, the insulating film 22 and the protective film 22a are collectively pattern-formed respectively in the pixel section 10A and the frame region 10B by etching using, for example, the photolithography method.

In this modification, effects equivalent to the effects in the first and second embodiments can be obtained by the laminated structure of the seal layer 20a and the protective film 22a. Further, the protective film 22a can be formed in a process same as a part of a process for forming the pixel section 10A. Therefore, it is possible to form the protective film 22a without adding a manufacturing process anew for formation of the protective film 22a (simply by changing a pattern of a photomask).

Modification 3

Figure 8:
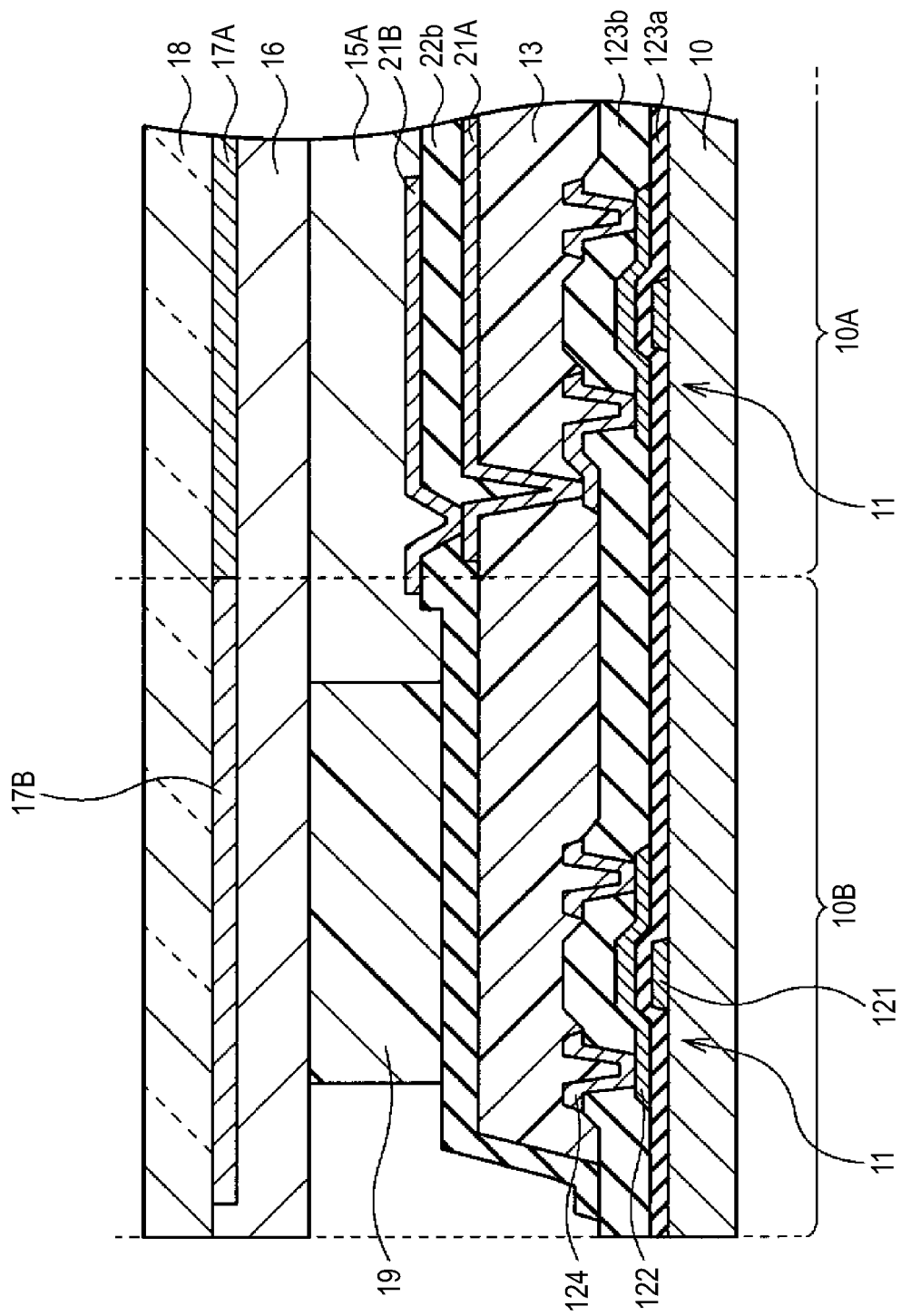
FIG. 8 is a sectional view of a schematic configuration of the vicinity of a boundary between a pixel section and a frame section of a liquid crystal display device according to a modification 3.

In the explanation of the modification 2, in the liquid crystal display device of the FFS mode, the protective film 22a and the insulating film 22 are separately provided and patterning is performed during the formation of the protective film 22a and the insulating film 22. However, a protective film and an insulating film do not have to be separated. Specifically, as shown in FIG. 8, an insulating film 22b provided in the pixel section 10A may be provided to extend to the frame region 10B (specifically, provided to cover the end edge portion 13e of the planarization film 13). A section corresponding to the frame region 10B may be caused to function as the protective film in the second embodiment and the modification 2. Like the insulating film 22, the insulating film 22b is formed of an inorganic insulating film of silicon oxide or the like.

In the modification 2 explained above, the protective film 22a is simultaneously pattern-formed in the process for forming the insulating film 22. However, in this modification, the insulating film 22b only has to be formed over the entire surface on the planarization film 13. The insulating film 22b does not need to be separated for each of the pixel section 10A and the frame region 10B. Therefore, the manufacturing process can be more simplified (simplification of a photomask pattern).

Other modifications (modifications 4 to 10) of the liquid crystal display devices explained in the first to third embodiments and the modifications 1 to 3 are explained below. As explained below, the display device according to the embodiment of the present disclosure is not limited to the liquid crystal display devices explained above and can adopt various configurations. In all the cases, effects equivalent to the effects in the first embodiment can be obtained. In the following explanation, the liquid crystal display device of the longitudinal electric field mode explained in the first embodiment is explained as an example. However, the modifications can also be applicable to the liquid crystal display device of the FFS mode or the IPS mode explained in the third embodiment and the like.

Modification 4

Figure 9:
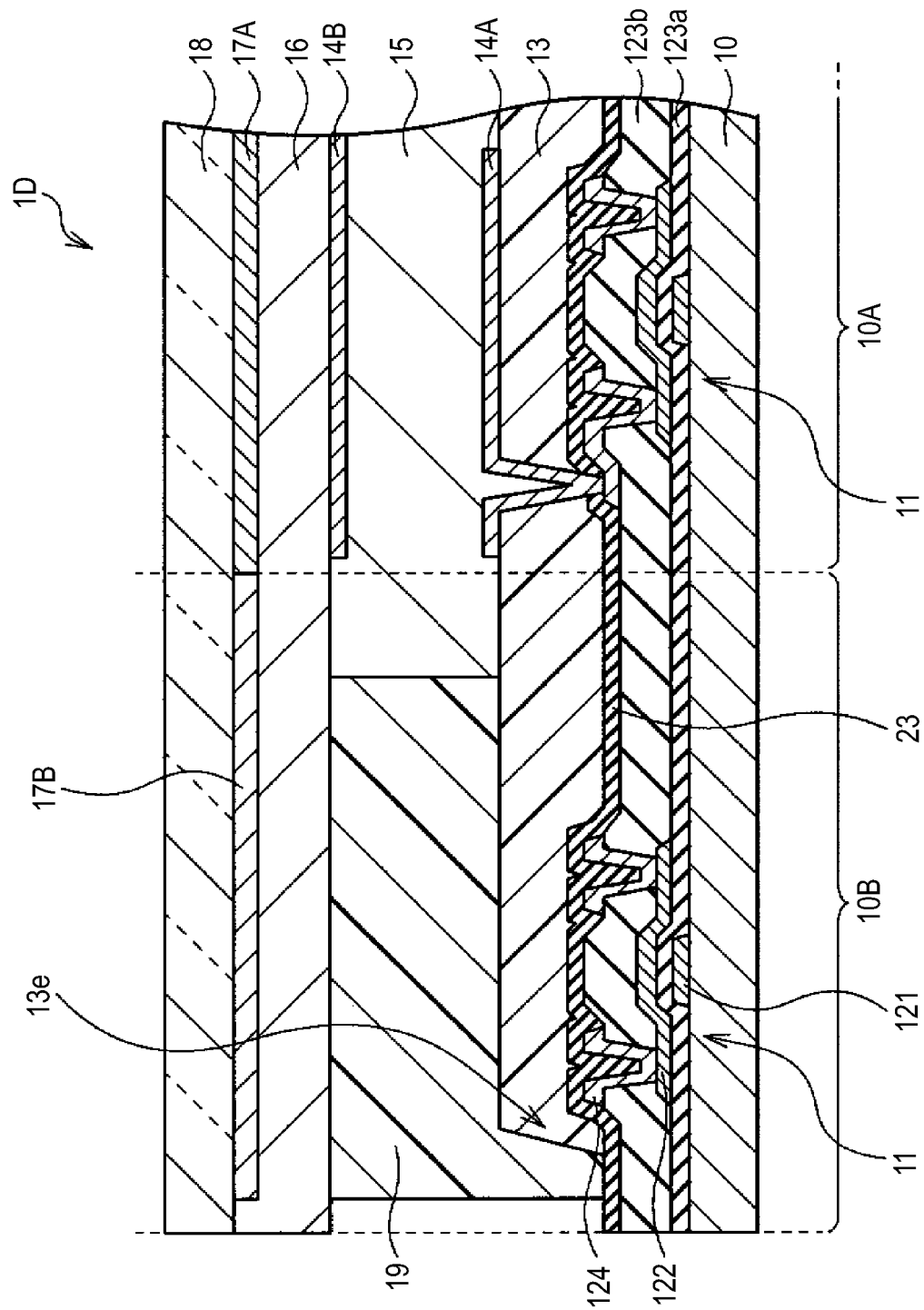
FIG. 9 is a sectional view of a schematic configuration of the vicinity of a boundary between a pixel section and a frame section of a liquid crystal display device according to a modification 4.

FIG. 9 is diagram of a sectional structure (a sectional structure in the vicinity of the boundary between the pixel section 10A and the frame region 10B) of a liquid crystal display device 1D according to a modification 4. In the liquid crystal display device 1D, as in the liquid crystal display device 1A according to the first embodiment, the pixel section 10A is sealed between the driving side substrate 10 and the opposed substrate 18. The pixel section 10A is bonded and sealed by the seal layer 19 in the frame region 10B. On the driving side substrate 10, the TFTs 11 are disposed in the frame region 10B. The planarization film 13 is provided to cover the TFTs 11. The seal layer 19 is formed to cover the end edge portion 13e of the planarization film 13.

However, in the liquid crystal display device 1D according to this modification, on the TFTs 11, specifically, over the entire surface on the interlayer insulating film 123b, an electrode protecting film 23 is provided to cover the source/drain electrodes 124. The electrode protecting film 23 is formed of, for example, a silicon oxide film, a silicon nitride film, or a silicon oxide nitride film. The planarization film 13 is provided on the electrode protecting film 23. By providing such an electrode protecting film 23, it is possible to effectively suppress intrusion of moisture into the TFTs 11 and the wiring layers.

Modification 5

Figure 10:
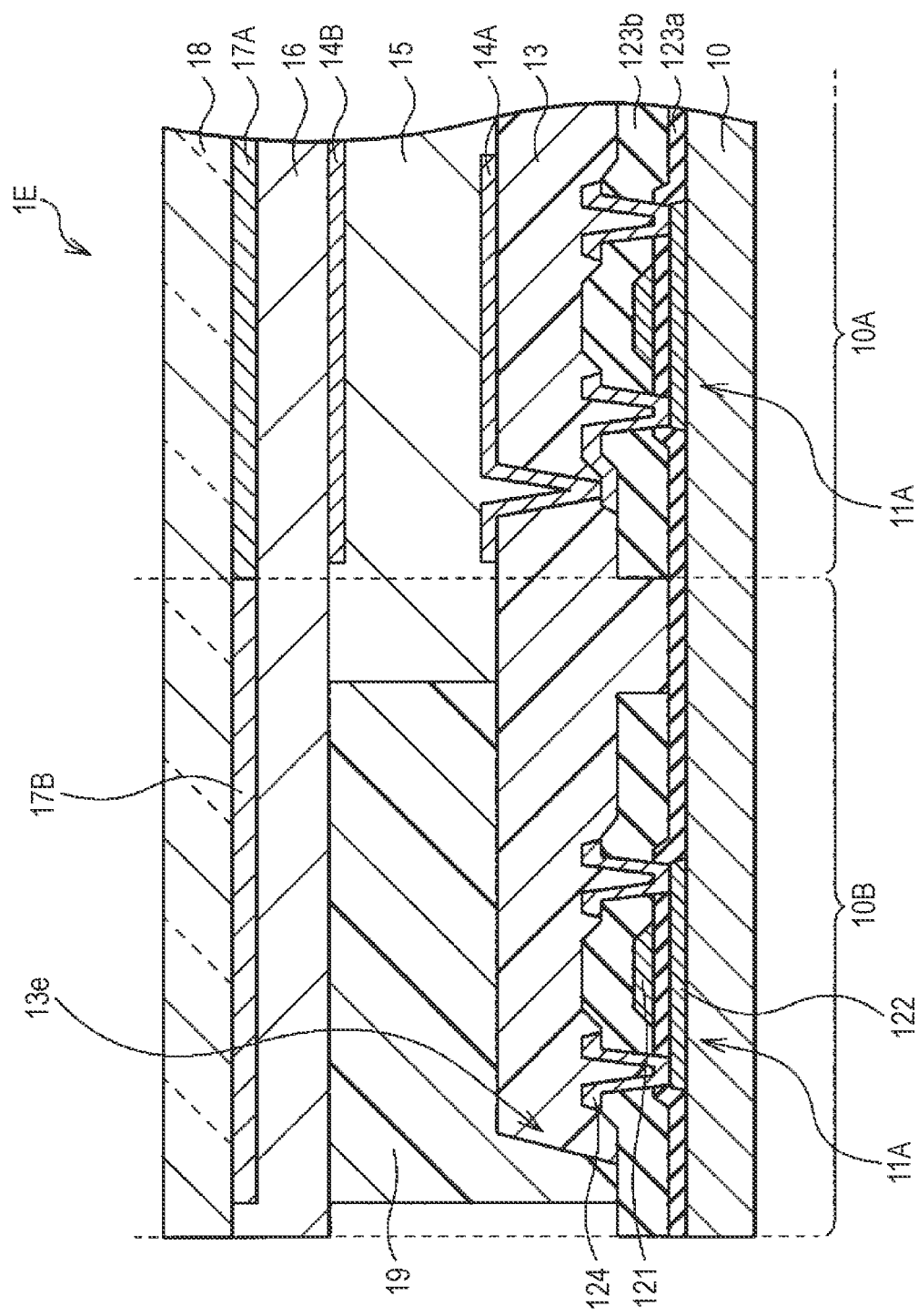
FIG. 10 is a sectional view of a schematic configuration of the vicinity of a boundary between a pixel section and a frame section of a liquid crystal display device according to a modification 5.

FIG. 10 is a sectional structure (a sectional structure of the vicinity of the boundary between the pixel section 10A and the frame region 10B) of a liquid crystal display device 1E according to a modification 5. In the liquid crystal display device 1E, as in the liquid crystal display device 1A according to the first embodiment, the pixel section 10A is sealed between the driving side substrate 10 and the opposed substrate 18. The pixel section 10A is bonded and sealed by the seal layer 19 in the frame region 10B. On the driving side substrate 10, TFTs 11A are disposed in the frame region 10B. The planarization film 13 is provided to cover the TFTs 11A. The seal layer 19 is formed to cover the end edge portion 13e of the planarization film 13.

However, in the liquid crystal display device 1E according to this modification, thin film transistors of a so-called top gate type (a stagger type) are used as the TFTs 11A. For example, the semiconductor layers 122 are provided on the driving side substrate 10. The gate electrodes 121 are disposed on the semiconductor layers 122 via the interlayer insulating film 123a. A interlayer insulating film 123b is provided to cover the interlayer insulating film 123a and the gate electrodes 121. On the interlayer insulating film 123b, the source/drain electrodes 124 are disposed to fill contact holes provided in the interlayer insulating films 123a and 123b. The source/drain electrodes 124 are electrically connected to the semiconductor layers 122.

Modification 6

Figure 11:
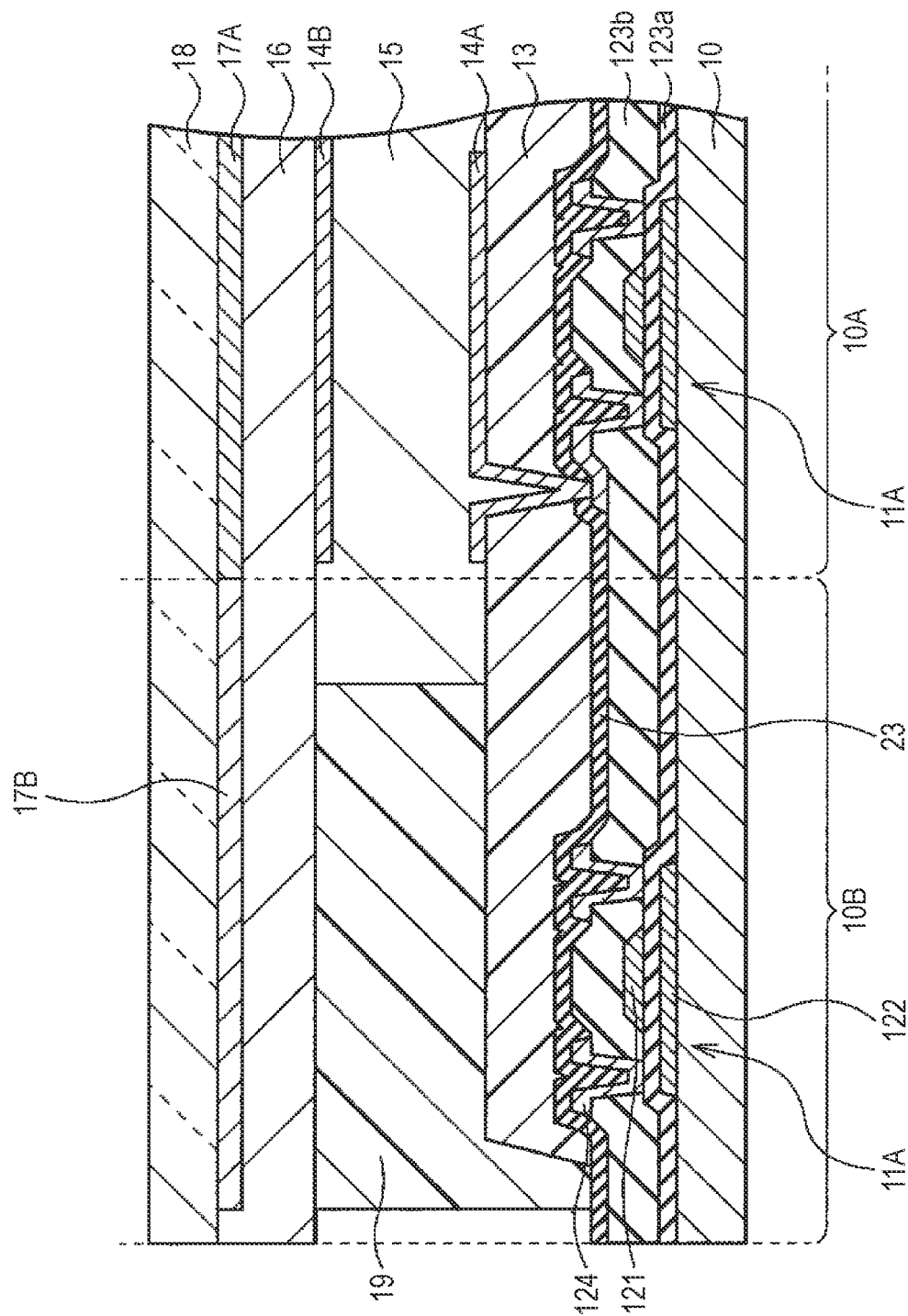
FIG. 11 is a sectional view of a schematic configuration of the vicinity of a boundary between a pixel section and a frame section of a liquid crystal display device according to a modification 6.

In the liquid crystal display device 1E including the TFTs 11A of the top gate type explained above, as in the liquid crystal display device 1A, as shown in FIG. 11, the electrode protecting film 23 may be provided on the TFTs 11A.

Modification 7

Figure 12:
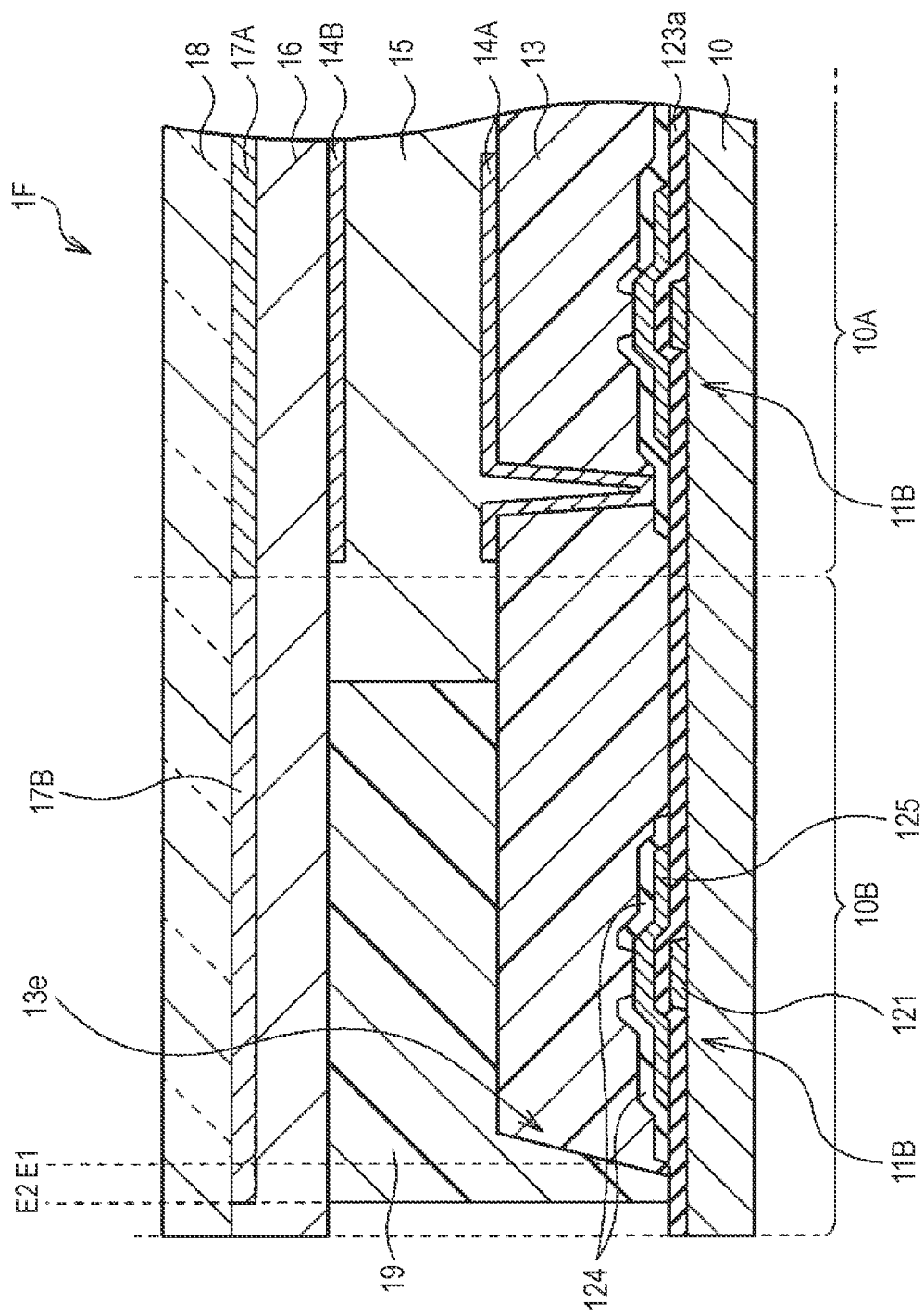
FIG. 12 is a sectional view of a schematic configuration of the vicinity of a boundary between a pixel section and a frame section of a liquid crystal display device according to a modification 7.

FIG. 12 is a diagram of a sectional structure (a sectional structure of the vicinity of the boundary between the pixel section 10A and the frame region 10B) of a liquid crystal display device 1F according to a modification 7. In the liquid crystal display device 1F, as in the liquid crystal display device 1A according to the first embodiment, the pixel section 10A is sealed between the driving side substrate 10 and the opposed substrate 18. The pixel section 10A is bonded and sealed by the seal layer 19 in the frame region 10B. On the driving side substrate 10, TFTs 11B are disposed in the frame region 10B. The planarization film 13 is provided to cover the TFTs 11B. The seal layer 19 is formed to cover the end edge portion 13e of the planarization film 13.

However, in the liquid crystal display device 1F according to this modification, the TFTs 11B are thin film transistors including amorphous silicon. In the TFTs 11B, the gate electrodes 121 are provided on the driving side substrate 10. Semiconductor layers 125 are formed on the gate electrodes 121 via the interlayer insulating film 123a. A pair of source/drain electrodes 124 are disposed to be separated from each other on each of the semiconductor layers 125. The planarization film 13 is formed to cover such TFTs 11B.

Modification 8

Figure 13:
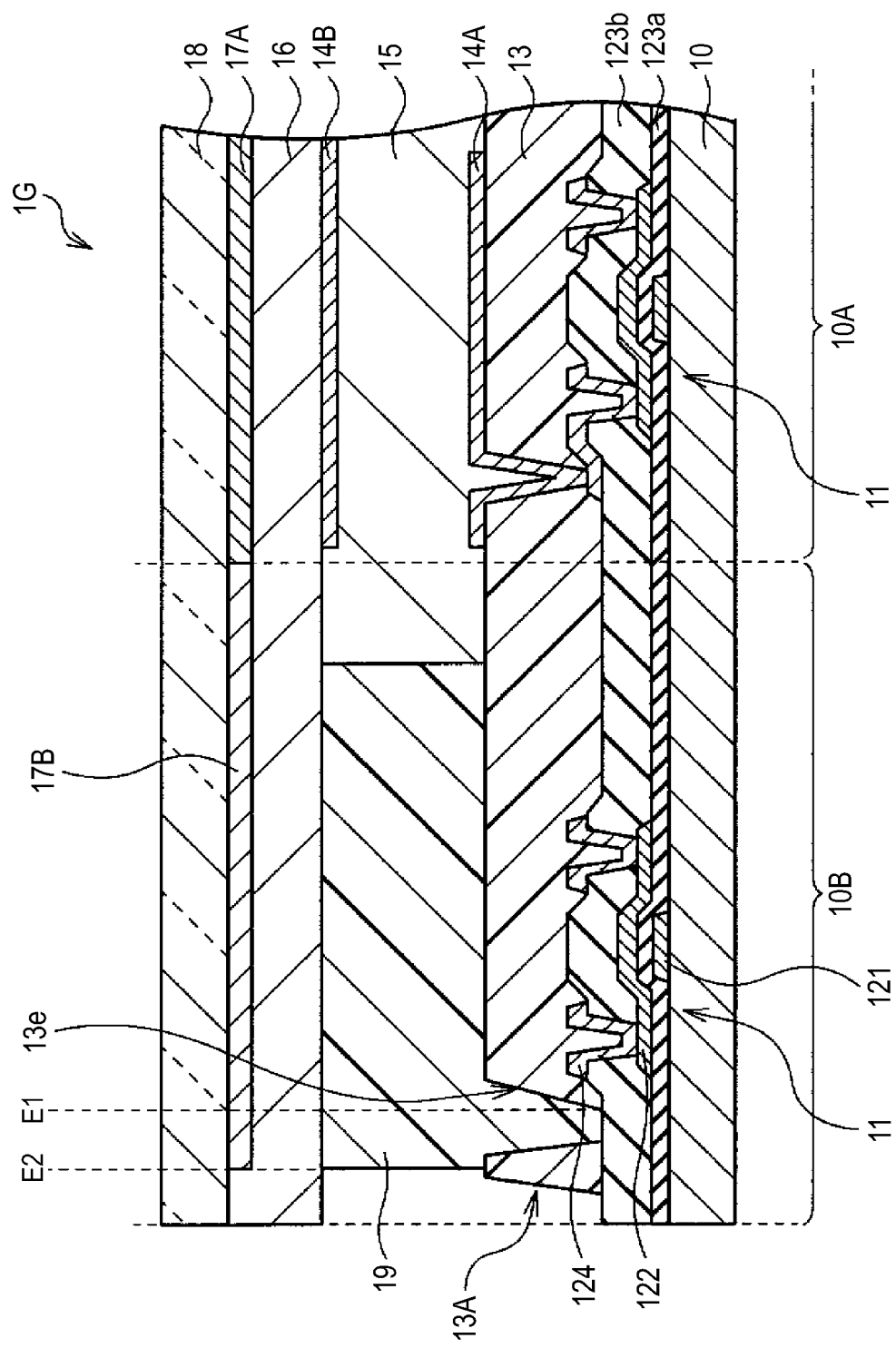
FIG. 13 is a sectional view of a schematic configuration of the vicinity of a boundary between a pixel section and a frame section of a liquid crystal display device according to a modification 8.

FIG. 13 is a diagram of a sectional structure (a sectional structure of the vicinity of the boundary between the pixel section 10A and the frame region 10B) of a liquid crystal display device 1G according to a modification 8. In the liquid crystal display device 1G, as in the liquid crystal display device 1A according to the first embodiment, the pixel section 10A is sealed between the driving side substrate 10 and the opposed substrate 18. The pixel section 10A is bonded and sealed by the seal layer 19 in the frame region 10B. In the frame region 10B on the driving side substrate 10, the seal layer 19 is formed to cover the end edge portion 13e of the planarization film 13 that covers the TFTs 11.

However, in the liquid crystal display device 1G according to this modification, in the frame region 10B, further on the outer side of the planarization film 13, a wall section 13A is provided at a predetermined space from the end edge E1 along a side surface of the end edge portion 13e of the planarization film 13 (to surround the end edge portion 13e). For example, the wall section 13A is formed of a material same as the material of the planarization film 13 and provided at thickness (height) same as the thickness of the planarization film 13. Such a wall section 13A can be collectively formed by, in a process for forming the planarization film 13, forming the organic insulating film (the photosensitive resin) explained above over the entire surface of a substrate using, for example, the coat method and then subjecting the organic insulating film to pattern exposure using the photography method. By providing such a wall section 13A, a seal material is filled between the wall section 13A and the end edge portion 13e. Even if the seal width varies, the end edge portion 13e of the planarization film 13 is easily covered.

Modification 9

Figure 14:
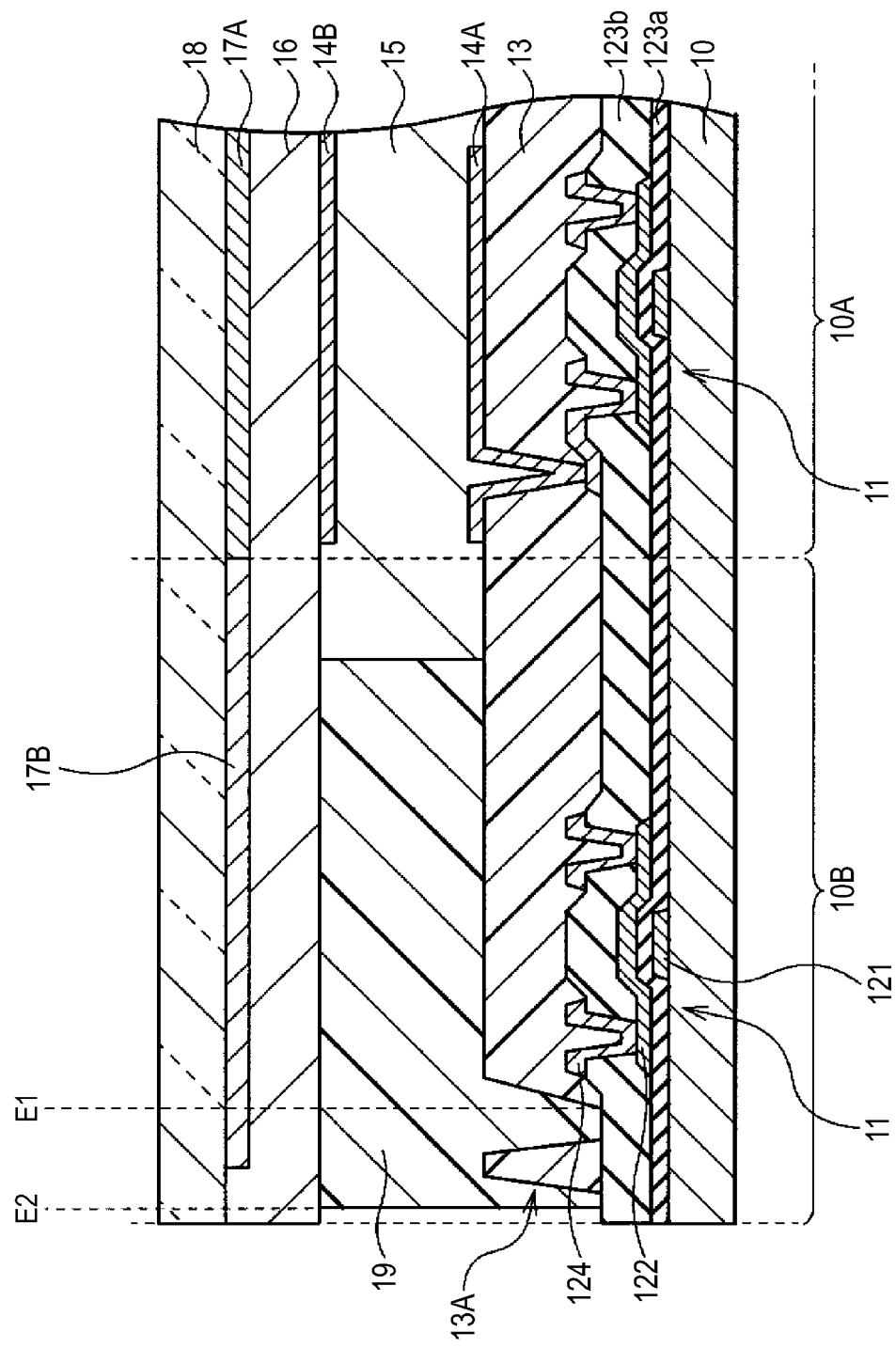
FIG. 14 is a sectional view of a schematic configuration of the vicinity of a boundary between a pixel section and a frame section of a liquid crystal display device according to a modification 9.

In the modification 8 explained above, the configuration in which the end edge E2 of the seal layer 19 is arranged further on the inner side than the wall section 13A is illustrated. However, as shown in FIG. 14, the end edge E2 of the seal layer 19 may be provided further on the outer side than the wall section 13A. The wall section 13A in the modifications 8 and 9 may be formed of a material same as the material of the planarization film 13 or may be formed of another material. The wall section 13A does not always have to be provided at thickness (height) same as the thickness of the planarization film 13.

Modification 10

Figure 15:
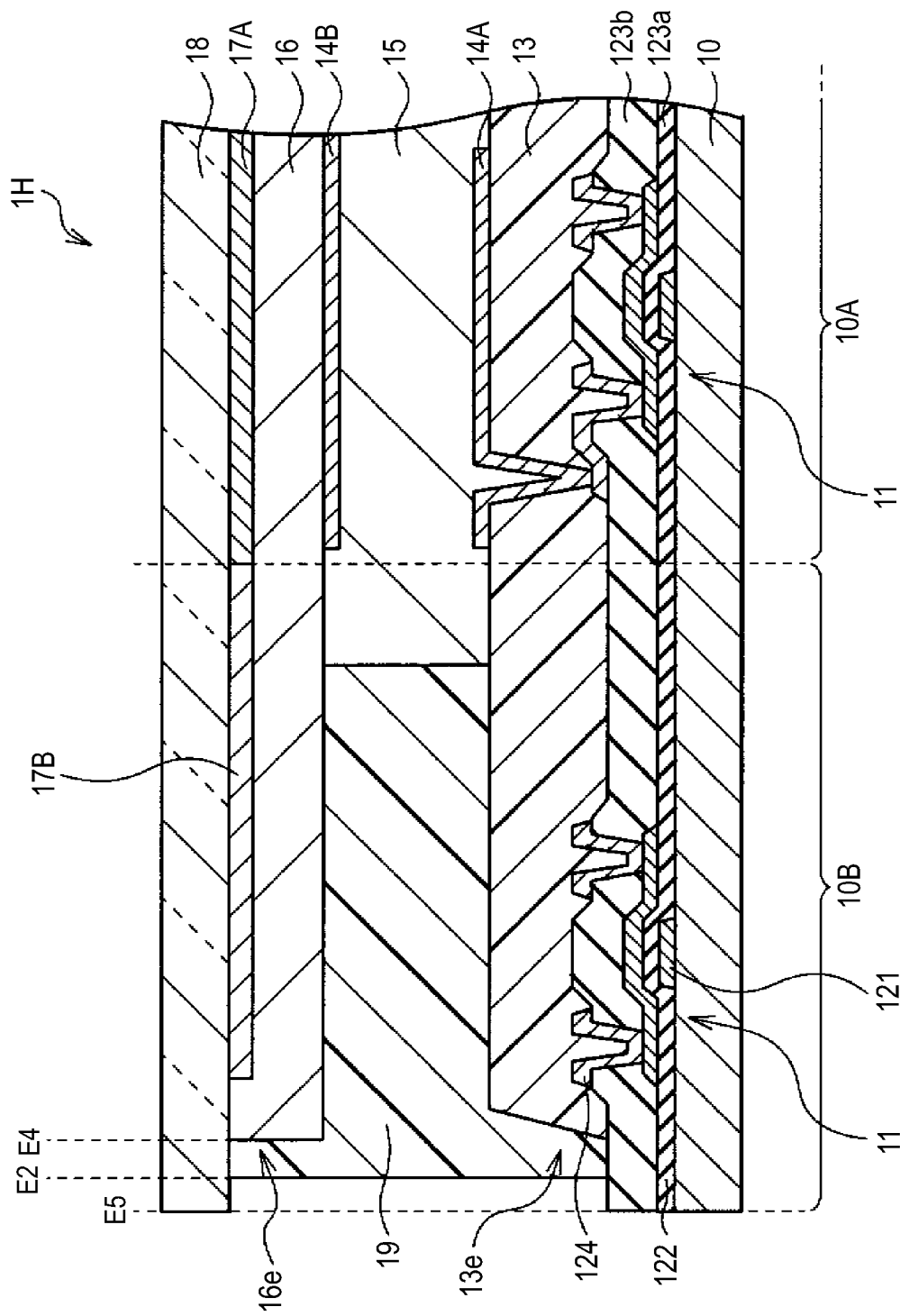
FIG. 15 is a sectional view of a schematic configuration of the vicinity of a boundary between a pixel section and a frame section of a liquid crystal display device according to a modification 10.

FIG. 15 is a diagram of a sectional structure (a sectional structure of the vicinity of the boundary between the pixel section 10A and the frame region 10B) of a liquid crystal display device 1H according to a modification 10. In the liquid crystal display device 1H, as in the liquid crystal display device 1A according to the first embodiment, the pixel section 10A is sealed between the driving side substrate 10 and the opposed substrate 18. The pixel section 10A is bonded and sealed by the seal layer 19 in the frame region 10B. In the frame region 10B on the driving side substrate 10, the seal layer 19 is formed to cover the end edge portion 13e of the planarization film 13 that covers the TFTs 11.

However, in the liquid crystal display device 1H according to this modification, in the frame region 10B, the seal layer 19 is formed to also cover an end edge portion 16e of the planarization film 16 provided on the opposed substrate 18 side. Specifically, an end edge E4 of the planarization film 16 is provided further on the inner side than an end edge E5 of the opposed substrate 18. The end edge E2 of the seal layer 19 is provided further on the outer side than the end edge E4 of the planarization film 16. Consequently, it is possible to suppress intrusion of moisture from the opposed substrate 18 side into the liquid crystal layer 15.

APPLICATION EXAMPLES

Application examples (a module and application examples 1 to 5) of the display devices (the liquid crystal display devices) explained in the embodiments and the modifications are explained with reference to FIGS. 16 to 21. The display devices according to the embodiments and the like can be applied to electronic apparatuses in all fields such as a television apparatus, a digital camera, a notebook personal computer, a portable terminal apparatus such as a cellular phone, and a video camera. In other words, the display devices according to the embodiments and the like explained above can be applied to electronic apparatuses in all the fields that display, as an image or a video, a video signal input from the outside or a video signal generated on the inside.

(Module)

Figure 16:
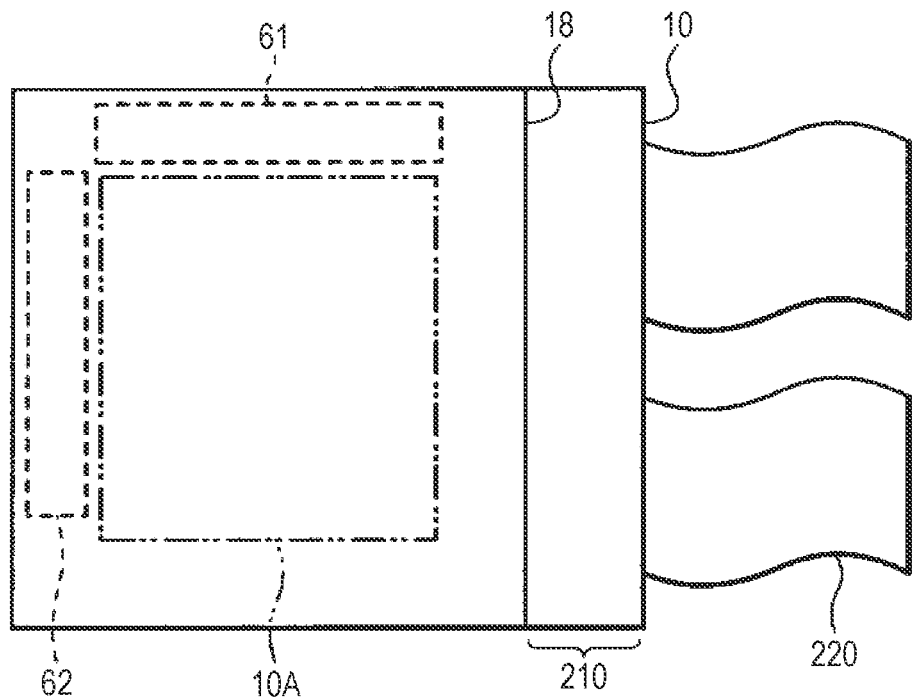

The display devices are incorporated in various electronic apparatuses such as application examples 1 to 5 explained below as, for example, a module shown in FIG. 16. In the module, for example, a region 210 exposed from the opposed substrate 18 is provided on one side of the driving side substrate 10. In the exposed region 210, wires of the signal line driving circuit 61 and the scanning line driving circuit 62 are extended to form external connection terminals (not shown). Flexible print wiring boards (FPCs; Flexible Printed Circuits) 220 for input and output of signals may be provided in the external connection terminals.

Application Example 1

Figure 17:
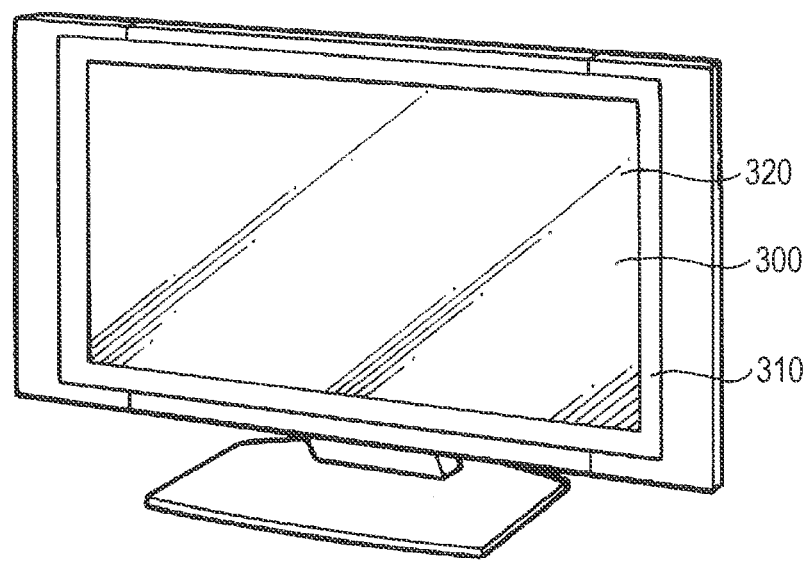
FIG. 17 is a perspective view of an external appearance of an application example 1.

FIG. 17 is a diagram of an external appearance of a television apparatus according to an application example 1. The television apparatus includes, for example, a video display screen unit 510 including a front panel 511 and a filter glass 512. The video display screen unit 510 is equivalent to the display devices according to the embodiments and the like explained above.

Application Example 2

Figure 18A:
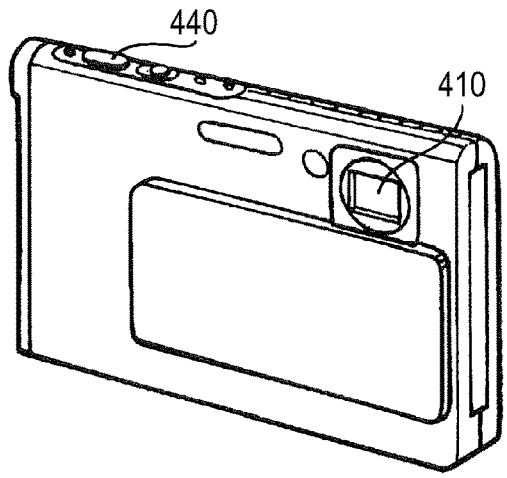
FIG. 18A is a perspective view of an external appearance of an application example 2 viewed from the front side.
Figure 18B:
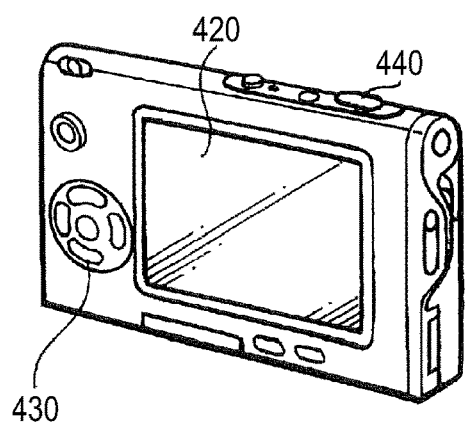
FIG. 18B is a perspective view of an external appearance of the application example 2 viewed from the rear side.

FIGS. 18A and 18B are diagrams of external appearances of a digital camera according to an application example 2. The digital camera includes, for example, a light emitting unit 521 for a flash, a display unit 522, a menu switch 523, and a shutter button 524. The display unit 522 is equivalent to the display devices according to the embodiments and the like explained above.

Application Example 3

Figure 19:
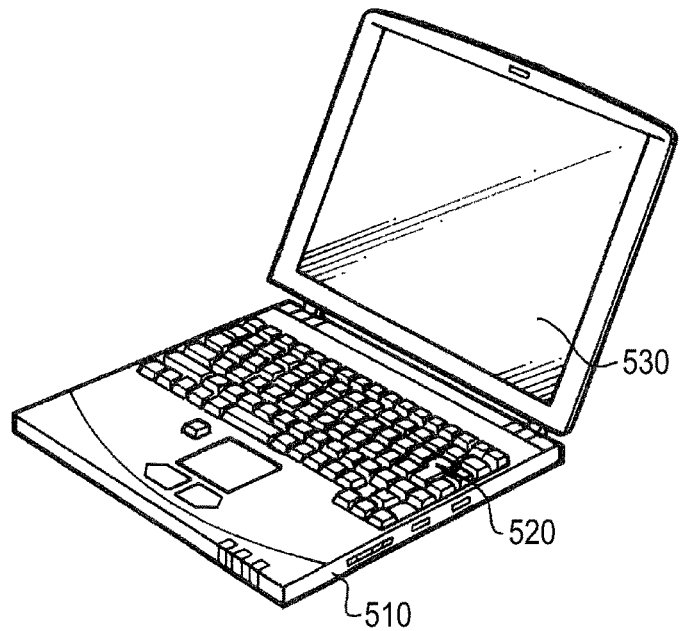
FIG. 19 is a perspective view of an external appearance of an application example 3.

FIG. 19 is a diagram of an external appearance of a notebook personal computer according to an application example 3. The notebook personal computer includes, for example, a main body 531, a keyboard 532 for input operation for characters and the like, and a display unit 533 that displays an image. The display unit 533 is equivalent to the display devices according to the embodiments and the like explained above.

Application Example 4

Figure 20:
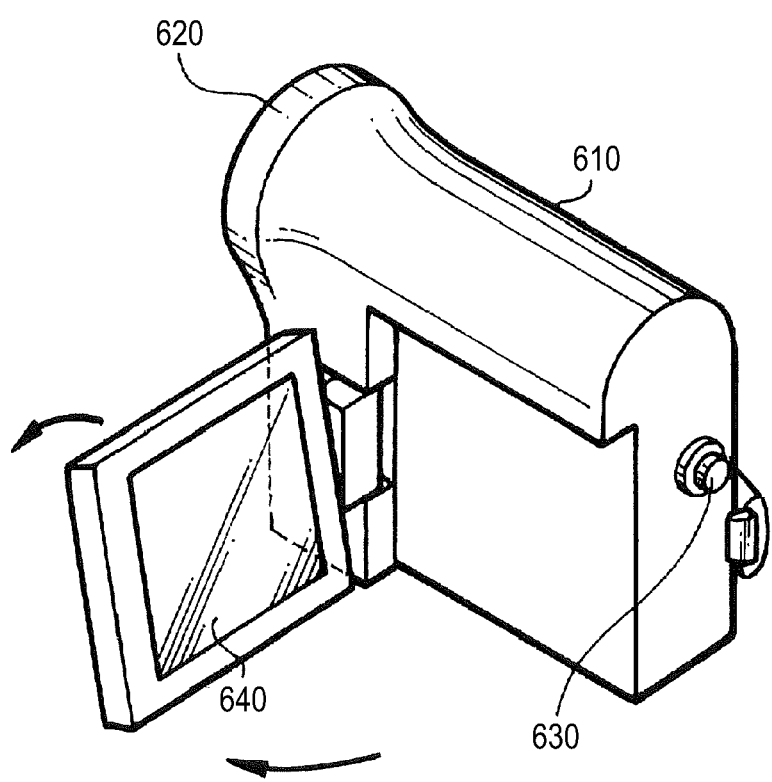
FIG. 20 is a perspective view of an external appearance of an application example 4.

FIG. 20 is a diagram of an external appearance of a video camera according to an application example 4. The video camera includes, for example, a main body unit 541, a lens 542 for subject photographing provided on the front side surface of the main body unit 541, a start/stop switch 543 used during photographing, and a display unit 544. The display unit 544 is equivalent to the display devices according to the embodiments and the like explained above.

Application Example 5

FIGS. 21A to 21G are diagrams of external appearances of a cellular phone according to an application example 5. In the cellular phone, for example, an upper housing 710 and a lower housing 720 are coupled by a coupling section (a hinge section) 730. The cellular phone includes a display 740, a sub-display 750, a picture light 760, and a camera 770. The display 740 or the sub-display 750 is equivalent to the display devices according to the embodiments and the like explained above.

The several embodiments, modifications, and application examples are explained above. However, the contents of the present disclosure are not limited to the embodiments and the like. For example, the planarization film formed of the organic insulating film is illustrated as the insulating film in the present disclosure. However, the planarization film is not limited to such an organic insulating film. An inorganic insulating film formed of, for example, silicon oxide, silicon nitride, or silicon oxide nitride may be used.

In the embodiments and the like explained above, the thin film transistor is explained as an example of the active component according to the present disclosure. However, the active component is not limited to this and only has to be an active component disposed in a peripheral circuit. The active component can also be applied to, for example, a diode and other switching components.

In the embodiments and the like explained above, the liquid crystal display devices are explained as an example. However, the display device in the present disclosure is not limited to such liquid crystal display devices. The display device can also be applied to an organic EL display device. In this case, as explained above, in the frame region 10B of the pixel section 10A, pixel driving circuits (e.g., a scanning line driving circuit, a signal line driving circuit, and a power supply line driving circuit) are provided and TFTs and wiring layers (a scanning line, a signal line, and a power supply line) are disposed. In the organic EL display device, a planarization film is formed on a driving side substrate to cover the TFTs and the like. On the planarization film, an anode electrode, an organic EL layer, and a cathode electrode electrically connected to sources and drains of the TFTs are laminated in this order.

The display device and the electronic apparatus in the present disclosure may have configurations explained in (1) to (17) below.

(1) A display device including: a pixel section provided between a pair of substrates and including plural pixels; one or plural active components disposed in a frame region around the pixel section on one substrate of the pair of substrates; an insulating film provided in the frame region on the one substrate to cover the one or plural active components; and a sealing layer provided to seal the pixel section and cover an end edge portion of the insulating film in the frame region.

(2) The display device according to (1), wherein the active component is a thin film transistor.

(3) The display device according to (2), wherein the thin film transistor and a wiring layer electrically connected to the thin film transistor are covered with the insulating film.

(4) The display device according to any one of (1) to (3), wherein the insulating film is a planarization film formed of an organic insulating film.

(5) The display device according to (4), wherein the sealing layer is formed of a seal material that bonds and seals the pixel section between the pair of substrates, and an end edge of the sealing layer is provided further on the outer side than an end edge of the insulating film.

(6) The display device according to any one of (3) to (5), wherein the sealing layer includes: a seal layer that bonds and seals the pixel section between the pair of substrates; and a protective film provided between the insulating film and the seal layer and provided to cover at least the end edge portion of the insulating film.

(7) The display device according to (6), wherein the protective film is formed of an inorganic insulating film.

(8) The display device according to any one of (1) to (7), wherein each of the plural pixels of the pixel section includes: a liquid crystal layer driven according to a longitudinal electric field mode; and a pair of electrodes arranged to be opposed to each other across the liquid crystal layer.

(9) The display device according to any one of (1) to (8), wherein each of the plural pixels of the pixel section includes: a liquid crystal layer display-driven according to a lateral electric field mode; and a pair of electrodes provided on the one substrate side of the liquid crystal layer.

(10) The display device according to (9), wherein the display device includes an interlayer insulating film between the pair of electrodes.

(11) The display device according to (10), wherein the sealing layer includes: a seal layer that bonds and seals the pixel section between the pair of substrates; and a protective film provided between the insulating film and the seal layer and provided to cover at least the end edge portion of the insulating film, and the protective film is formed of a material same as a material of the interlayer insulating film.

(12) The display device according to any one of (1) to (11), wherein the display device includes a wall section around the end edge portion of the insulating film.

(13) The display device according to any one of (1) to (12), wherein the display device includes, on the pixel section side of the other substrate of the pair of substrates, a color filter layer and another insulating film that covers the color filter layer, and the sealing layer is provided to cover an end edge portion of the other insulating film.

(14) The display device according to any one of (2) to (13), wherein the display device includes an electrode protecting film on the thin film transistor.

(15) The display device according to any one of (2) to (14), wherein the thin film transistor is a bottom gate type thin film transistor.

(16) The display device according to any one of (2) to (15), wherein the thin film transistor is a top gate type thin film transistor.

(17) The display device according to any one of (2) to (16), wherein the thin film transistor includes a semiconductor layer formed of low-temperature polysilicon, microcrystalline silicon, or amorphous silicon.

The present disclosure contains subject matter related to that disclosed in Japanese Priority Patent Application JP 2011-127599 filed in the Japan Patent Office on Jun. 7, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A display device comprising:
a pair of substrates facing each other;
a pixel section between the substrates;
a frame region around the pixel section;
a thin film transistor on one of the substrates in the pixel section, the thin film transistor including a gate insulating film;
an organic insulating film located in the pixel section and in the frame region;
an inorganic insulating film covering an edge of the organic insulating film in the frame region, the edge including an uppermost surface and a side surface of the organic insulating film; and a seal layer covering the edge of the organic insulating film in the frame region and overlapping the inorganic insulating film, wherein, the thin film transistor is entirely covered by the organic insulating film, the gate insulating film and the inorganic insulating film extend beyond the edge of the organic insulating film in the frame region, and the inorganic insulating film is not in direct contact with the gate insulating film.

2. The display device according to claim 1, wherein the thin film transistor is a bottom gate type thin film transistor.

3. The display device according to claim 1, wherein the thin film transistor is a top gate type thin film transistor.

4. The display device according to claim 1, wherein the thin film transistor includes a semiconductor layer formed of low-temperature polysilicon, microcrystalline silicon, or amorphous silicon.

5. The display device according to claim 1, wherein the inorganic film includes a silicon oxide, a silicon nitride, or a silicon oxide nitride.

6. The display device according to claim 1, wherein organic insulating film includes a polyimide, a Novolac resin, or an acrylic resin.

7. The display device according to claim 1, further comprising a liquid crystal layer between the pair of substrates.

8. The display device according to claim 7, further comprising a pair of electrodes on one substrate of the pair of substrates in the pixel section, wherein, the liquid crystal layer is driven by a lateral electric field generated between the pair of electrodes.

9. A display device comprising:
a pair of substrates facing each other;
a pixel section between the substrates;
a frame region around the pixel section;
a thin film transistor on one of the substrates in the pixel section, the thin film transistor including a gate insulating film;
an organic insulating film located in the pixel section and in the frame region;
an inorganic insulating film covering an entire surface of the organic insulating film, the entire surface being an entirety of an uppermost surface of the organic insulating film in the frame region; and
a seal layer covering an edge of the organic insulating film in the frame region and overlapping the inorganic insulating film, the edge including the uppermost surface and a side surface of the organic insulating film, wherein, the inorganic insulating film is not in direct contact with the gate insulating film, the thin film transistor is entirely covered by the organic insulating film, and the gate insulating film and the inorganic insulating film extend beyond the edge of the organic insulating film in the frame region.

10. The display device according to claim 9, wherein the thin film transistor is a bottom gate type thin film transistor.

11. The display device according to claim 9, wherein the thin film transistor is a top gate type thin film transistor.

12. The display device according to claim 9, wherein the thin film transistor includes a semiconductor layer formed of low-temperature polysilicon, microcrystalline silicon, or amorphous silicon.

13. The display device according to claim 9, wherein the inorganic film includes a silicon oxide, a silicon nitride, or a silicon oxide nitride.

14. The display device according to claim 9, wherein organic insulating film includes a polyimide, a Novolac resin, or an acrylic resin.

15. The display device according to claim 9, wherein the inorganic film is in the frame region and the pixel region.

16. The display device according to claim 9, further comprising a liquid crystal layer between the pair of substrates.

17. The display device according to claim 16, further comprising a pair of electrodes on one substrate of the pair of substrates in the pixel section, wherein, the liquid crystal layer is driven by a lateral electric field generated between the pair of electrodes.

* * * * *